United States Patent
Naito

(10) Patent No.: US 11,527,639 B2
(45) Date of Patent: Dec. 13, 2022

(54) SEMICONDUCTOR DEVICE

(71) Applicant: FUJI ELECTRIC CO., LTD., Kanagawa (JP)

(72) Inventor: Tatsuya Naito, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 222 days.

(21) Appl. No.: 17/086,436

(22) Filed: Nov. 1, 2020

(65) Prior Publication Data

US 2021/0050435 A1 Feb. 18, 2021

Related U.S. Application Data

(60) Division of application No. 16/167,560, filed on Oct. 23, 2018, now Pat. No. 10,833,182, which is a
(Continued)

(30) Foreign Application Priority Data

Nov. 17, 2016 (JP) .............................. JP2016-223908
Jan. 17, 2017 (JP) .............................. JP2017-006175

(51) Int. Cl.
*H01L 29/66* (2006.01)
*H01L 29/739* (2006.01)
(Continued)

(52) U.S. Cl.
CPC ........ *H01L 29/7397* (2013.01); *H01L 21/225* (2013.01); *H01L 27/0761* (2013.01);
(Continued)

(58) Field of Classification Search
None
See application file for complete search history.

(56) References Cited

U.S. PATENT DOCUMENTS

2005/0263853 A1* 12/2005 Tomomatsu ........ H01L 29/1095
257/E29.066
2007/0114598 A1 5/2007 Hotta
(Continued)

FOREIGN PATENT DOCUMENTS

JP 2001127286 A 5/2001
JP 2005210047 A 8/2005
(Continued)

OTHER PUBLICATIONS

International Search Report for International Patent Application No. PCT/JP2017/040822, issued by the Japan Patent Office dated Jan. 23, 2018.

(Continued)

*Primary Examiner* — Grant S Withers

(57) ABSTRACT

A semiconductor device includes a semiconductor substrate, an emitter region, a base region and multiple accumulation areas, and an upper accumulation area in the multiple accumulation areas is in direct contact with a gate trench section and a dummy trench section, in an arrangement direction that is orthogonal to a depth direction and an extending direction, a lower accumulation area furthest from the upper surface of the semiconductor substrate in the multiple accumulation areas has: a gate vicinity area closer to the gate trench section than the dummy trench section in the arrangement direction; and a dummy vicinity area closer to the dummy trench section than the gate trench section in the arrangement direction, and having a doping concentration of the first conductivity type lower than that of the gate vicinity area.

15 Claims, 18 Drawing Sheets

Related U.S. Application Data continuation of application No. PCT/JP2017/040822, filed on Nov. 13, 2017.

(51) Int. Cl.

| | | |
|---|---|---|
| *H01L 29/861* | (2006.01) | |
| *H01L 29/423* | (2006.01) | |
| *H01L 29/06* | (2006.01) | |
| *H01L 21/225* | (2006.01) | |
| *H01L 27/07* | (2006.01) | |
| *H01L 29/08* | (2006.01) | |
| *H01L 29/10* | (2006.01) | |
| *H01L 29/417* | (2006.01) | |
| *H01L 29/51* | (2006.01) | |
| *H01L 29/40* | (2006.01) | |

(52) U.S. Cl.
CPC ........ *H01L 29/0696* (2013.01); *H01L 29/083* (2013.01); *H01L 29/0804* (2013.01); *H01L 29/0821* (2013.01); *H01L 29/1004* (2013.01); *H01L 29/41708* (2013.01); *H01L 29/4236* (2013.01); *H01L 29/4238* (2013.01); *H01L 29/517* (2013.01); *H01L 29/66136* (2013.01); *H01L 29/66348* (2013.01); *H01L 29/66545* (2013.01); *H01L 29/739* (2013.01); *H01L 29/8613* (2013.01); *H01L 27/0727* (2013.01); *H01L 29/0834* (2013.01); *H01L 29/407* (2013.01)

(56) References Cited

U.S. PATENT DOCUMENTS

| | | |
|---|---|---|
| 2007/0267663 A1 | 11/2007 | Harada |
| 2008/0197379 A1 | 8/2008 | Aono |
| 2015/0123164 A1 | 5/2015 | Park |
| 2017/0025410 A1* | 1/2017 | Cheng ................ H01L 29/0834 |
| 2018/0108738 A1 | 4/2018 | Naito |
| 2018/0138299 A1 | 5/2018 | Naito |

FOREIGN PATENT DOCUMENTS

| | | |
|---|---|---|
| JP | 2005347289 A | 12/2005 |
| JP | 2007311627 A | 11/2007 |
| JP | 2008078397 A | 4/2008 |
| JP | 2008205015 A | 9/2008 |
| JP | 2010232627 A | 10/2010 |
| JP | 2014007254 A | 1/2014 |
| JP | 2014063961 A | 4/2014 |
| JP | 2015135954 A | 7/2015 |

OTHER PUBLICATIONS

U.S. Appl. No. 16/167,560, filed Oct. 23, 2018, to Tatsuya Naito.

* cited by examiner

SEMICONDUCTOR DEVICE

CROSS-REFERENCE TO RELATED APPLICATIONS

This application is a divisional application of U.S. patent application Ser. No. 16/167,560, filed on Oct. 23, 2018, which is a continuation of International Application No. PCT/JP2017/040822, filed on Nov. 13, 2017, which claims priority to Japanese Patent Application No. 2016-223908, filed on Nov. 17, 2016, and No. 2017-006175, filed on Jan. 17, 2017, the contents of each of which are hereby incorporated herein by reference in their entirety.

BACKGROUND

1. Technical Field

The present invention relates to a semiconductor device.

2. Related Art

Conventionally, an insulated gate type bipolar transistor (IGBT) with a charge stored layer has been known (see Patent document 1, for example).

PRIOR ART DOCUMENT

Patent Document

Patent document 1: Japanese Patent Application Publication No. 2007-311627

The larger a displacement current that flows in a gate electrode of the IGBT during a low-current turn-on, the shorter a turn-on time of the IGBT. In a semiconductor device with the IGBT, the shorter the turn-on time, the larger a voltage reduction rate in a voltage between collector and emitter (hereinafter, referred to as 'dV/dt'). As dV/dt is larger, an electromagnetic noise becomes larger.

SUMMARY

In a first aspect of the present invention, a semiconductor device is provided. The semiconductor device may comprise a semiconductor substrate, an emitter region, a base region, a gate trench section and a dummy trench section, and multiple accumulation areas. The semiconductor substrate may have a drift region of a first conductivity type. The emitter region may be provided over the drift region inside the semiconductor substrate. The emitter region may have a doping concentration of the first conductivity type higher than a doping concentration of the first conductivity type of the drift region. The base region may be provided between the emitter region and the drift region inside the semiconductor substrate. The base region may be of a second conductivity type. The gate trench section and the dummy trench section may be provided to extend from an upper surface of the semiconductor substrate to the drift region by passing through the emitter region and the base region. The gate trench section and the dummy trench section each may have a conductive section in the interior. The multiple accumulation areas may be provided side by side in a depth direction from the upper surface of the semiconductor substrate toward the lower surface thereof, under the base region and between the gate trench section and the dummy trench section. The multiple accumulation areas each may include a region having a doping concentration of the first conductivity type higher than the doping concentration of the first conductivity type of the drift region. The upper accumulation area closest to the upper surface of the semiconductor substrate in the multiple accumulation areas may be in direct contact with the gate trench section and the dummy trench section, in an arrangement direction of the gate trench section and the dummy trench section orthogonal to an extending direction thereof and the depth direction. In a top view of the semiconductor substrate, the extending direction may be the direction in which the longitudinal portions of the gate trench section and the dummy trench section extend. The lower accumulation area may have a gate vicinity area and a dummy vicinity area. The lower accumulation area may be the furthest one from the upper surface of the semiconductor substrate in the multiple accumulation areas. The gate vicinity area may be closer to the gate trench section than the dummy trench section in the arrangement direction. The dummy vicinity area may be closer to the dummy trench section than the gate trench section in the arrangement direction. The dummy vicinity area may have a doping concentration of the first conductivity type lower than that of the gate vicinity area.

The dummy vicinity area may have a doping concentration of the first conductivity type that is the same as the doping concentration of the first conductivity type in the drift region.

The dummy vicinity area may have a doping concentration of the first conductivity type that is higher than the doping concentration of the first conductivity type in the drift region, and that is lower than a peak concentration in the doping concentration of the first conductivity type of the gate vicinity area in the depth direction.

The multiple accumulation areas may have an intermediate accumulation area located between the upper accumulation area and the lower accumulation area. The intermediate accumulation area may have the gate vicinity area and the dummy vicinity area. The gate vicinity area may be closer to the gate trench section than the dummy trench section in the arrangement direction. The dummy vicinity area may be closer to the dummy trench section than the gate trench section in the arrangement direction. In the intermediate accumulation area, the doping concentration of the first conductivity type in the gate vicinity area may be higher than the doping concentration of the first conductivity type in the dummy vicinity area. In the intermediate accumulation area, the length of the gate vicinity area in the arrangement direction area may be shorter than the length of the gate vicinity area in the lower accumulation area in the arrangement direction.

The multiple accumulation areas may have an intermediate accumulation area located between the upper accumulation area and the lower accumulation area. The intermediate accumulation area may have the gate vicinity area and the dummy vicinity area. The gate vicinity area may be closer to the gate trench section than the dummy trench section in the arrangement direction. The dummy vicinity area may be closer to the dummy trench section than the gate trench section in the arrangement direction. The doping concentration of the first conductivity type of the gate vicinity area in the intermediate accumulation area may be higher than the doping concentration of the first conductivity type of the gate vicinity area in the lower accumulation area.

When the length between the gate trench section and the dummy trench section in the arrangement direction is defined as Wm, and the length of the gate vicinity area in the intermediate accumulation area in the arrangement direction is defined as Wa, Wm and Wa may satisfy an expression: 0.55≤Wa/Wm≤0.95.

The lower accumulation area may be located in the lower end vicinity of the gate trench section in the depth direction.

In a second aspect of the present invention, a manufacturing method of a semiconductor device is provided. A manufacturing method of the semiconductor device may comprise: forming a trench section; ion implanting impurities of the first conductivity type on the whole transistor section from the upper surface of the semiconductor substrate; and ion implanting the impurities of the first conductivity type in the state where a mask material is provided over the dummy trench section in the transistor section. The semiconductor substrate may include a drift region of the first conductivity type. The trench section may have the gate trench section and the dummy trench section. In the ion implanting the impurities of the first conductivity type on the whole transistor section from the upper surface of the semiconductor substrate, the upper accumulation area may be formed. The upper accumulation area may be closest to the upper surface of the semiconductor substrate. The transistor section may include the gate trench section and the dummy trench section. In the ion implanting the impurities of the first conductivity type in the state where the mask material is provided over the dummy trench section in the transistor section, at least the lower accumulation area may be formed. The lower accumulation area may be furthest from the upper surface of the semiconductor substrate. In the arrangement direction of the gate trench section and the dummy trench section, the upper accumulation area may be in direct contact with the gate trench section and the dummy trench section. The arrangement direction may be the direction orthogonal to the extending direction and the depth direction. In a top view of the semiconductor substrate, the extending direction may be the direction in which the longitudinal portions of the gate trench section and the dummy trench section extend. The depth direction may be the direction from the upper surface of the semiconductor substrate toward the lower surface. The lower accumulation area may have the gate vicinity area and the dummy vicinity area. The gate vicinity area may be closer to the gate trench section than the dummy trench section in the arrangement direction. The dummy vicinity area may be closer to the dummy trench section than the gate trench section in the arrangement direction. The dummy vicinity area may have a doping concentration of the first conductivity type lower than that of the gate vicinity area.

In the ion implanting the impurities of the first conductivity type in the state where the mask material is provided over the dummy trench section in the transistor section, forming the intermediate accumulation area may be included. The intermediate accumulation area may be located between the upper accumulation area and the lower accumulation area.

The impurities of the first conductivity type may be phosphorus or protons.

Note that summary clause does not necessarily describe all necessary features of the embodiments of the present invention. The present invention may also be a sub-combination of the features described above.

BRIEF DESCRIPTION OF THE DRAWINGS

FIG. 7 is a view showing simulations of Vge and Vce during a low-current turn-on.

DESCRIPTION OF EXEMPLARY EMBODIMENTS

Hereinafter, embodiments of the present invention will be described. The embodiments do not limit the invention according to the claims, and all the combinations of the features described in the embodiments are not necessarily essential to means provided by aspects of the invention.

Figure 1:
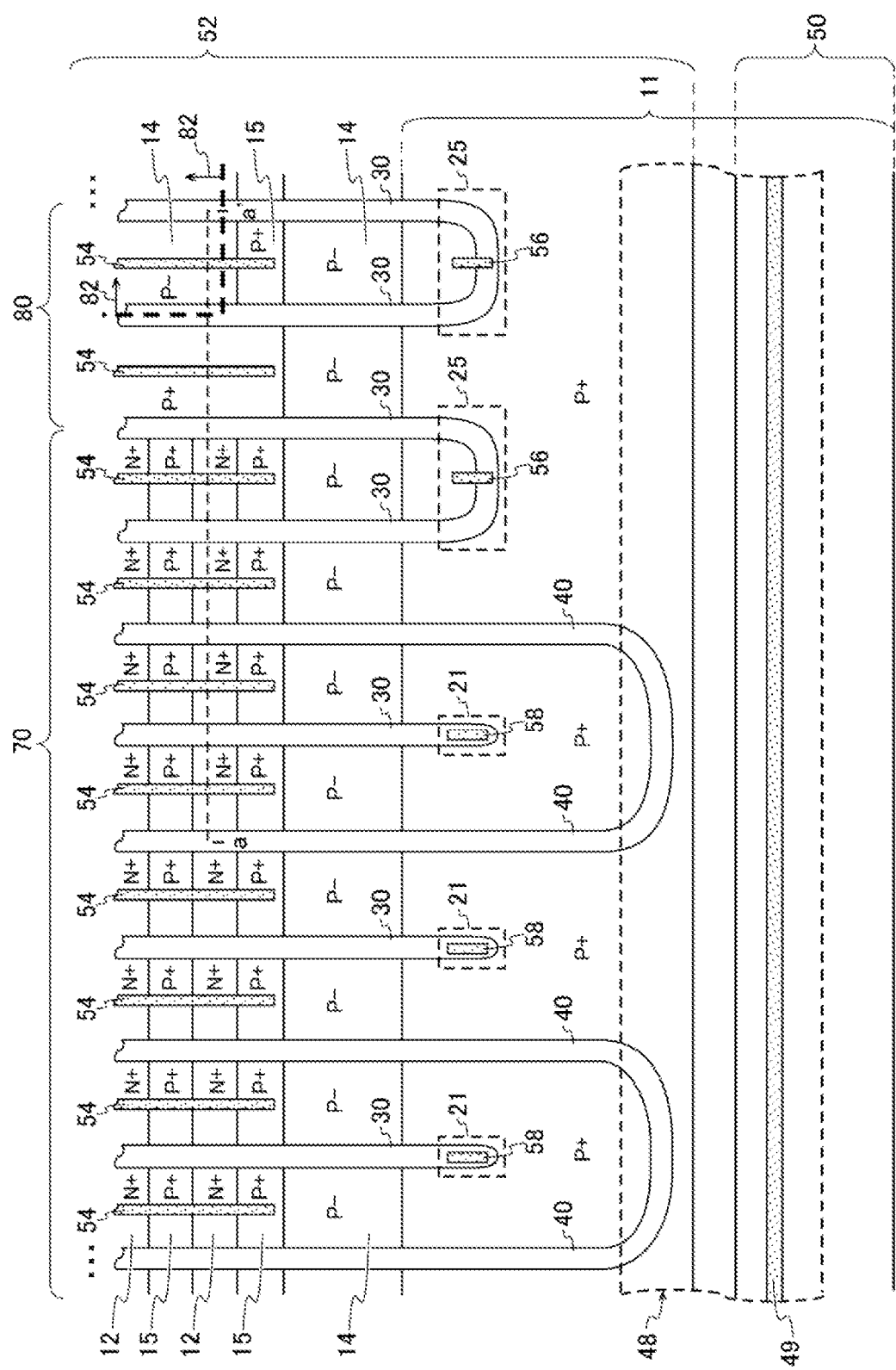
FIG. 1 is a view showing a part of the upper surface of a semiconductor device 100 according to an embodiment of the present invention.

FIG. 1 is a view showing a part of an upper surface of a semiconductor device 100 according to an embodiment in the present invention. The semiconductor device 100 of the present example is a semiconductor chip that has a transistor section 70 including a transistor such as IGBT and a diode section 80 including a diode such as FWD. The diode section 80 is provided adjacent to the transistor section 70 in the upper surface of a semiconductor substrate. In FIG. 1, a part of the upper surface of the chip around the chip end portion is shown, and other regions are omitted.

Also, although FIG. 1 shows an active region of the semiconductor substrate in the semiconductor device 100, the semiconductor device 100 may have an edge termination portion surrounding the active region. The active region refers to a region through which an electric current flows when the semiconductor device 100 is controlled to be in an on-state. The edge termination portion has a functionality that mitigates an electric field crowding in an upper surface vicinity of the semiconductor substrate. The edge termination portion has more than one structure of, for example, a guard ring, a field plate, a RESURF and a combination thereof.

The semiconductor device 100 of the present example comprises a well region 11, an emitter region 12, a base region 14, a contact region 15, a dummy trench section 30 and a gate trench section 40, each of which is provided to a predetermined depth from the upper surface of the semiconductor substrate. Also, the semiconductor device 100 of the present example comprises a gate metal layer 50 and an emitter electrode 52 provided over the upper surface of the semiconductor substrate. The gate metal layer 50 and the emitter electrode 52 are provided with separated from each other.

Note that as used herein, in some cases the dummy trench section 30 and the gate trench section 40 are generically referred to as 'trench section.' In the present example, the direction in which the dummy trench section 30 and the gate trench section 40 are arranged at a predetermined interval is referred to as 'arrangement direction.' Also, in the present example, the arrangement direction of the trench section is a direction in parallel to X-axis.

In the present example, the extending direction of the trench section is a direction in parallel to Y-axis. The X-axis and the Y-axis are axes orthogonal to each other in a plane parallel to the upper surface of the semiconductor substrate. Also, the axis orthogonal to the X-axis and the Y-axis is defined as the Z-axis. Note that as used herein, in some cases, a direction in parallel to Z-axis is referred to as 'depth direction of the semiconductor substrate.'

Note that as used herein, the terms "upper," "lower," "over," and "under" are not limited to a vertical direction in the gravitational direction. These terms merely refer to a relative direction to a predetermined axis.

Although an interlayer dielectric film is provided between the emitter electrode 52 and the gate metal layer 50, and the upper surface of the semiconductor substrate, it is omitted in FIG. 1. The interlayer dielectric film of the present example has contact holes 49, 54, 56 and 58. The contact holes 49, 54, 56 and 58 of the present example are provided by passing through the interlayer dielectric film.

The emitter electrode 52 is in contact with the emitter region 12 and the contact region 15 on the upper surface of the semiconductor substrate through the contact hole 54. Also, the emitter electrode 52 is electrically connected to the base region 14 through the contact region 15 via the contact hole 54. Also, the emitter electrode 52 is connected to a dummy conductive section within the dummy trench section 30 through the contact hole 56 and the contact hole 58. A connecting portion 21 or a connecting portion 25 may be provided between the emitter electrode 52 and the dummy conductive section, which is formed of a conductive material such as polysilicon doped with impurities. The connecting portion 21 and the connecting portion 25 each are provided on the upper surface of the semiconductor substrate through the insulating film.

The gate metal layer 50 is contact with a gate metal runner 48 via the contact hole 49. The gate metal runner 48 may be formed of polysilicon doped with impurities, or the like. The gate metal runner 48 is connected to a gate conductive section within the gate trench section 40 on the upper surface of the semiconductor substrate. The gate metal runner 48 is not electrically connected to the dummy conductive section and the emitter electrode 52 within the dummy trench section 30. The gate metal runner 48 may be electrically separated from the emitter electrode 52 by the interlayer dielectric film. The gate metal runner 48 of the present example is provided from a portion under the contact hole 49 to a tip portion of the gate trench section 40. At the tip portion of the gate trench section 40, the gate conductive section is exposed to the upper surface of the semiconductor substrate, and is in contact with the gate metal runner 48.

The emitter electrode 52 and the gate metal layer 50 are formed of a material containing a metal. For example, at least some regions of each electrode are formed of aluminum or an aluminum-silicon alloy or the like. Each electrode may have a barrier metal formed of titanium, a titanium compound or the like in an under layer of a region formed of aluminum or the like, and may have a plug formed of tungsten or the like within the contact hole. The plug may have the barrier metal on the side that is in contact with the semiconductor substrate, tungsten is embedded to be in contact with the barrier metal, so that the tungsten may be in contact with the region formed of aluminum or the like through the barrier metal.

One or more gate trench sections 40 and one or more dummy trench sections 30 are arranged at a predetermined interval along a predetermined arrangement direction in a region of the transistor section 70. In the transistor section 70, one or more gate trench sections 40 and one or more dummy trench sections 30 may be provided alternately along the arrangement direction.

The gate trench section 40 of the present example may have two longitudinal portions which extend along the extending direction, and have a connecting portion which connects between the two longitudinal portions. At least part of the connecting portion is preferably provided in a curved shape. When the end portions of the two longitudinal portions in the gate trench section 40 are connected, the electric field concentration at the end portions of the longitudinal portions can be mitigated. The gate metal runner 48 may be connected to the gate conductive section at the connecting portion of the gate trench section 40.

In the transistor section 70 of the present example, the dummy trench section 30 is provided between the longitudinal portions of the gate trench section 40. These dummy trench sections 30 have a straight shape to extend in the extending direction.

Note that in the transistor section 70, a plurality of dummy trench sections 30 may be arranged at a boundary with the diode section 80. At the boundary portion in the transistor section 70 of the present example, the two dummy trench sections 30 adjacent in the arrangement direction are provided without the gate trench section 40 sandwiched therebetween. The dummy trench section 30 provided at the boundary portion may also include the longitudinal portion and the connecting portion. Note that in the present example, the number of trench sections refers to the number of longitudinal portions of the trench sections arranged in the arrangement direction. The dummy trench section 30 having the connecting portion and the dummy trench section 30 having a straight shape may have the same length in the extending direction.

The number of dummy trench sections 30 arranged serially at the boundary with the diode section 80 may be greater than the number of dummy trench sections 30 arranged serially inside the transistor section 70 away from the diode section 80.

In the example of FIG. 1, in the transistor section 70 at the boundary with the diode section 80, two dummy trench sections 30 are arranged adjacently. In contrast, inside the transistor section 70, the gate trench sections 40 and the dummy trench sections 30 are arranged alternately one by one.

The emitter electrode 52 is provided over the well region 11, the emitter region 12, base region 14, the contact region 15, the dummy trench section 30 and the gate trench section 40. The well region 11 is provided within a predetermined range from the end portion of the active region in the vicinity of the gate metal layer 50. The diffusion depth of the well region 11 may be greater than each depth of the dummy trench sections 30 and the gate trench sections 40. Some regions close to the gate metal layer 50 of the dummy trench section 30 and the gate trench section 40 are provided in the well region 11. A bottom of an end of the dummy trench section 30 in the extending direction may be covered by the well region 11.

In the present example, the portion sandwiched by the individual trench sections is referred to as 'mesa portion.' The mesa portion has a base region 14. The base region 14 is of the second conductivity type and has a lower doping concentration than that of the well region 11. The base region 14 of the present example is of P− type. Note that in the present example, the first conductivity type is defined as N type, and the second conductivity type is defined as P type. Note that in another example, the first conductivity type may be defined as P type, and the second conductivity type may be defined as N type.

The mesa portion has the contact region 15 of the second conductivity type having a doping concentration higher than that of the base region 14 on the upper surface of the base region 14. The contact region 15 of the present example is of P+ type. Also, in the transistor section 70, the emitter region 12 is selectively provided in direct contact with the contact region 15 on the upper surface of the base region 14. The emitter region 12 has a doping concentration of the first conductivity type higher than a doping concentration of the first conductivity type of the drift region in the semiconductor substrate. The emitter region 12 of the present example is of N+ type.

Each of the contact region 15 and the emitter region 12 is provided from one of the adjacent trench sections to the other. One or more contact regions 15 and one or more emitter regions 12 of the transistor section 70 are provided to be exposed to the uppermost surface of the mesa portion alternately along the extending direction of the trench section.

In another example, the mesa portion in the transistor section 70 may have the contact region 15 and the emitter region 12 with a stripe pattern in parallel to the extending direction. For example, the emitter region 12 is provided in a region in direct contact with the trench section, and the contact region 15 is provided in a region sandwiched between the emitter regions 12.

The emitter region 12 may not be provided in the mesa portion of the diode section 80. In the present example, in the mesa portion of the diode section 80, the contact region 15 is provided in a region opposed to at least one contact region 15 in the transistor section 70. The diode section 80 of the present example has an N+ type cathode region 82 that is exposed to the lower surface of the semiconductor substrate. In FIG. 1, the range in which the cathode region 82 is provided is shown partially by a dashed line. The cathode region 82 may be provided in the range of the same depth as that of a P+ type collector region described later (that is, a range in the Z-axis direction). Although the collector region is omitted in FIG. 1, the collector region may be provided in a portion other than the portion in which the cathode region 82 is provided in an X-Y plane.

In the present example, the collector region is also provided in the region under the mesa portion in direct contact with the transistor section 70, in the mesa portion of the diode section 80. That is, the collector region extends to the region under that mesa portion in the X-axis direction, and the cathode region 82 is not provided in the region under that mesa portion in the X-axis direction. Thereby, as compared to the case where the cathode region 82 is provided on the whole diode section 80 in the X-axis direction, a distance between the emitter region 12, which is provided in the mesa portion in direct contact with the diode section 80 in the mesa portion of the transistor section 70, and the cathode region 82 of the diode section 80 can be ensured. Therefore, the electrons injected into the transistor section 70 from the gate structure section to the drift layer can be prevented from being flown out to the cathode region 82 of the diode section 80.

In the transistor section 70, the contact hole 54 is provided over each region of the contact region 15 and the emitter region 12. The contact hole 54 is not provided in a region which corresponds to the base region 14 or the well region 11.

In the diode section 80, the contact hole 54 is provided over the contact region 15 and the base region 14. The contact hole 54 of the present example is not provided over the base region 14 closest to the gate metal layer 50, among the plurality of base regions 14 in the mesa portion of the diode section 80. In the present example, the contact hole 54 of the transistor section 70 and the contact hole 54 of the diode section 80 have the same length in the extending direction.

Figure 2:
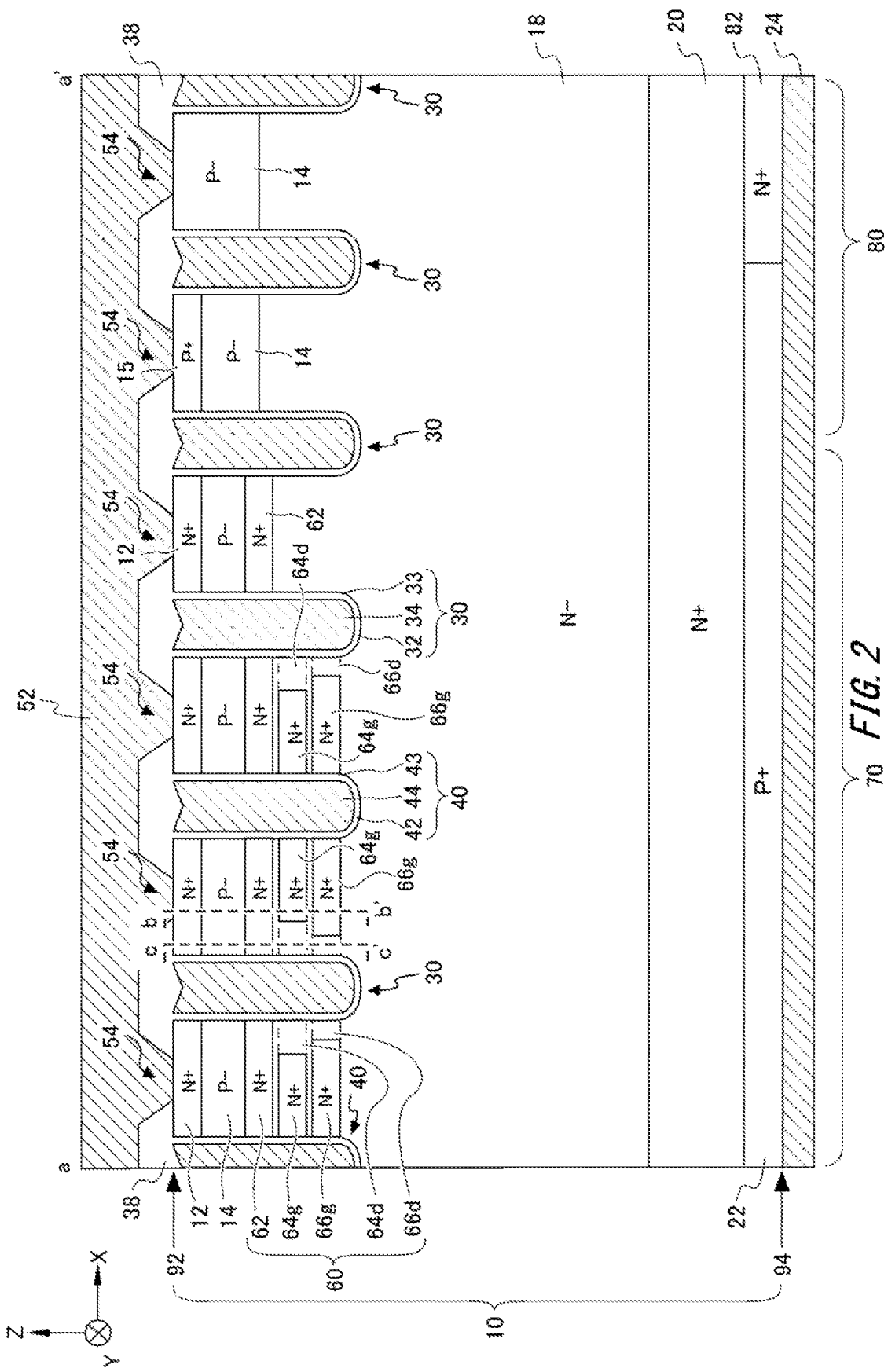
FIG. 2 is a view showing one example in a section a-a' in FIG. 1.

FIG. 2 is a view showing one example in a section a-a' in FIG. 1. In FIG. 2, a semiconductor substrate 10, an interlayer dielectric film 38, an emitter electrode 52 and a collector electrode 24 are additionally shown. The emitter electrode 52 is located on the upper surface 92 of the semiconductor substrate 10 and the interlayer dielectric film 38. Note that the aforementioned depth direction may be the direction from the upper surface 92 of the semiconductor substrate 10 toward the lower surface 94.

The collector electrode 24 is in direct contact with the lower surface 94 of the semiconductor substrate 10. The collector electrode 24 and the emitter electrode 52 are formed of a conductive material such as a metal. The semiconductor substrate 10 may be a silicon substrate, may be a silicon carbide substrate, may be a gallium oxide substrate or may be a nitride semiconductor substrate such as gallium nitride or the like. The semiconductor substrate 10 of the present example is a silicon substrate.

In the section of FIG. 2, the mesa portion of the transistor section 70 has an N+ type emitter region 12, a P− type base region 14 and multiple accumulation areas 60 in turn from the upper surface 92 toward the lower surface 94. The transistor section 70 of the emitter region 12 is provided from the interior of the semiconductor substrate 10 to the upper surface 92. The transistor section 70 has a drift region 18 of the first conductivity type under the mesa portion. The drift region 18 of the present example is of N− type.

The multiple accumulation areas 60 are provided under the base region 14, and side by side in the depth direction between the gate trench section 40 and the dummy trench section 30. In this manner, the base region 14 of the transistor section 70 is located between the emitter region 12 and the multiple accumulation areas 60 located over the drift region 18, in the interior of the semiconductor substrate 10.

The multiple accumulation areas 60 each include a region having a doping concentration of the first conductivity type higher than the doping concentration of the first conductivity type in the drift region 18. The multiple accumulation areas 60 of the present example each are of N+ type. When the multiple accumulation areas 60 each having a higher concentration than that in the drift region 18 are provided between the drift region 18 and the base region 14, a carrier injection enhancement effect (Injection Enhanced Effect: IE effect) is increased, which can reduce the on-voltage.

In the present example, the multiple accumulation areas 60 includes the upper accumulation area 62, the intermediate accumulation area 64 and the lower accumulation area 66 in turn from the upper surface 92 toward the lower surface 94. The upper accumulation area 62 is the accumulation area closest to the upper surface 92 of the semiconductor substrate 10 in the multiple accumulation areas 60. In contrast, the lower accumulation area 66 is the accumulation area furthest from the upper surface 92 of the semiconductor substrate 10 in the multiple accumulation areas 60. Also, the intermediate accumulation area 64 is the accumulation area located between the upper accumulation area 62 and the lower accumulation area 66 in the depth direction.

Note that in another example, the multiple accumulation areas 60 may have two or more intermediate accumulation areas 64 between the upper accumulation area 62 and the lower accumulation area 66. Further, in still another example, the multiple accumulation areas 60 may have only the upper accumulation area 62 and the lower accumulation area 66 without having the intermediate accumulation area 64.

The mesa portion of the transistor section 70 adjacent to the diode section 80 has the N+ type emitter region 12, the P− type base region 14 and the N+ type upper accumulation area 62 in turn from the upper surface 92 toward the lower surface 94. However, in another example, the mesa portion of the transistor section 70 adjacent to the diode section 80 may not have the upper accumulation area 62. Also, that mesa portion in still another example may include the upper accumulation area 62, the intermediate accumulation area 64 and the lower accumulation area 66.

The mesa portion of the diode section 80 has the P− type base region 14 that is exposed to the upper surface 92. However, the mesa portion of the diode section 80 adjacent to the transistor section 70 has the contact region 15 on the base region 14. That contact region 15 is exposed to the upper surface 92. Note that the diode section 80 does not have the multiple accumulation areas 60. Additionally, as not shown, a P type high concentration area shallower than the contact region 15 may be formed on the upper surface of the base region 14. That P type high concentration area reduces the contact resistance between the base region 14 and the emitter electrode 52. In particular, when the plug is formed, the reduction effect of the contact resistance is greater.

In both of the transistor section 70 and the diode section 80, an N+ type buffer region 20 is provided on a lower surface of the drift region 18. The doping concentration of the buffer region 20 may be higher than the doping concentration of the drift region 18. The buffer region 20 of the present example includes an N+ type impurity region having a plurality of peaks of the doping concentration in the depth direction. The buffer region 20 may serve as a field stop layer that prevents a depletion layer that expands from the lower surface of the base region 14, from reaching the P+ type collector region 22 and the N+ type cathode region 82.

The transistor section 70 has the P+ type collector region 22 on a lower surface of the buffer region 20. Also, the diode section 80 has an N+ type cathode region 82 on the lower surface of the buffer region 20. In the present example, the transistor section 70 is defined as a region such that a predetermined unit structure including the emitter region 12 and the contact region 15 is regularly arranged, in a virtual projection region where within the active region, the collector region 22 is projected from the lower surface 94 to the upper surface 92 in a direction perpendicular to the lower surface 94. Also, in the present example, the diode section 80 is defined as a region such that a predetermined unit structure including the emitter region 12 and the contact region 15 are not regularly arranged, in a virtual projection region where within the active region, the collector region 22 and the cathode region 82 are projected from the lower surface 94 to the upper surface 92 in the direction perpendicular to the lower surface 94.

One or more dummy trench sections 30 and one or more gate trench sections 40 pass through the base region 14 from the upper surface 92 of the semiconductor substrate 10, and reach the drift region 18. For regions provided with at least either of the emitter region 12, the contact region 15 and the upper accumulation area 62, the dummy trench section 30 also passes through these regions and reaches the drift region 18. Similarly, for regions provided with at least either of the emitter region 12, the contact region 15, the upper accumulation area 62, the intermediate accumulation area 64 and the lower accumulation area 66, the gate trench section 40 also passes through these regions and reaches the drift region 18. Note that the configuration in which the trench section passes through impurity regions is not limited to the one manufactured by a sequence of forming the trench section after forming the impurity regions. It is assumed that the configuration by forming the impurity region between the trench sections after forming the trench sections also falls within the one in which the trench section passes through the impurity region.

The gate trench section 40 includes a gate trench 43, a gate insulating film 42 and a gate conductive section 44 provided in the semiconductor substrate 10. The gate insulating film 42 is provided to cover the inner wall of the gate trench 43. The gate insulating film 42 may be formed by oxidizing or nitriding the semiconductor of the inner wall of the gate trench 43. The gate conductive section 44 is provided inside the gate trench 43 at a more inner side than the gate insulating film 42. That is, the gate insulating film 42 insulates the gate conductive section 44 from the semiconductor substrate 10. The gate conductive section 44 is formed of a conductive material such as polysilicon.

A part of the gate conductive section 44 faces the base region 14 in the arrangement direction. The portion facing the gate conductive section 44 in the base region 14 may serve as a channel formation region. When a predetermined voltage is applied to the gate conductive section 44, a channel is formed in the surface layer of the interface that is in contact with the gate trench 43 in the base regions 14. Note that the gate trench section 40 in FIG. 2 is covered with the interlayer dielectric film 38 on the upper surface 92 of the semiconductor substrate 10.

The dummy trench section 30 in FIG. 2 may have a structure similar to that of the gate trench section 40. The dummy trench section 30 includes a dummy trench 33, a dummy trench insulating film 32 and a dummy conductive section 34 provided in the semiconductor substrate 10. The dummy trench insulating film 32 is provided to cover an inner wall of the dummy trench 33. The dummy conductive section 34 is provided inside the dummy trench 33 and provided at a more inner side than the dummy trench insulating film 32. The dummy trench insulating film 32 insulates the dummy conductive section 34 from the semiconductor substrate 10. The dummy conductive section 34 may be formed of the same material as the gate conductive section 44. For example, the dummy conductive section 34 is formed of a conductive material such as polysilicon. The dummy conductive section 34 may have the same length as the gate conductive section 44 in the depth direction. The dummy trench section 30 in FIG. 2 is also covered with the interlayer dielectric film 38 on the upper surface 92 of the semiconductor substrate 10.

The upper accumulation area 62 of the present example is in direct contact with the gate trench section 40 and the dummy trench section 30 in the arrangement direction (X-axis direction). That is, the upper accumulation area 62 covers the whole lower surface of the base region 14 in each mesa portion.

The lower accumulation area 66 of the present example has a gate vicinity area 66g and a dummy vicinity area 66d. The gate vicinity area 66g is the region closer to the gate trench section 40 than the dummy trench section 30 in the arrangement direction. That is, the gate vicinity area 66g extends from the gate trench section 40 in the arrangement direction, but does not reach the dummy trench section 30. In contrast, the dummy vicinity area 66d is the region closer to the dummy trench section 30 than the gate trench section 40 in the arrangement direction. The dummy vicinity area 66d of the present example has a length, in the arrangement direction, from the end portion closest to the dummy trench section 30 of the gate vicinity area 66g to the sidewall closest to the gate trench section 40 in the dummy trench section 30.

The gate vicinity area 66g may have an N type doping concentration not less than the N type doping concentration of the upper accumulation area 62. In contrast, the dummy vicinity area 66d may have an N type doping concentration lower than that of the gate vicinity area 66g. The dummy vicinity area 66d of the present example may have an N type doping concentration that is higher than the N type doping concentration of the drift region 18, and that is lower than the N type doping concentration of the upper accumulation area 62. Instead of this, as described later, the doping concentration of the dummy vicinity area 66d may be the same as the N type doping concentration of the drift region 18. In the lower accumulation area 66, the gate vicinity area 66g may contribute mainly to the IE effect.

The intermediate accumulation area 64 is located between the upper accumulation area 62 and the lower accumulation area 66 in the depth direction. Similarly to the lower accumulation area 66, the intermediate accumulation area 64 also has the gate vicinity area 64g and the dummy vicinity area 64d. In the present example, the N type doping concentration of the gate vicinity area 64g is greater than the N type doping concentration in the dummy vicinity area 64d. In the present example, one layer of the upper accumulation area 62, one layer of the intermediate accumulation area 64 and one layer of the lower accumulation area 66 are provided, but the number of layers of each accumulation area is not limited to the above. For example, the accumulation areas by two layers composed of either of the intermediate accumulation area 64 and the lower accumulation area 66, and the upper accumulation area 62 may be provided. Also, at least one accumulation area of the upper accumulation area 62, the intermediate accumulation area 64 and the lower accumulation area 66 may be provided by multiple layers.

Although the details will be described later, due to the configuration of the multiple accumulation areas 60 in the present example, the displacement current can be suppressed that flows from the dummy trench section 30 to the gate trench section 40 during a low-current turn-on of an IGBT.

Figure 3:
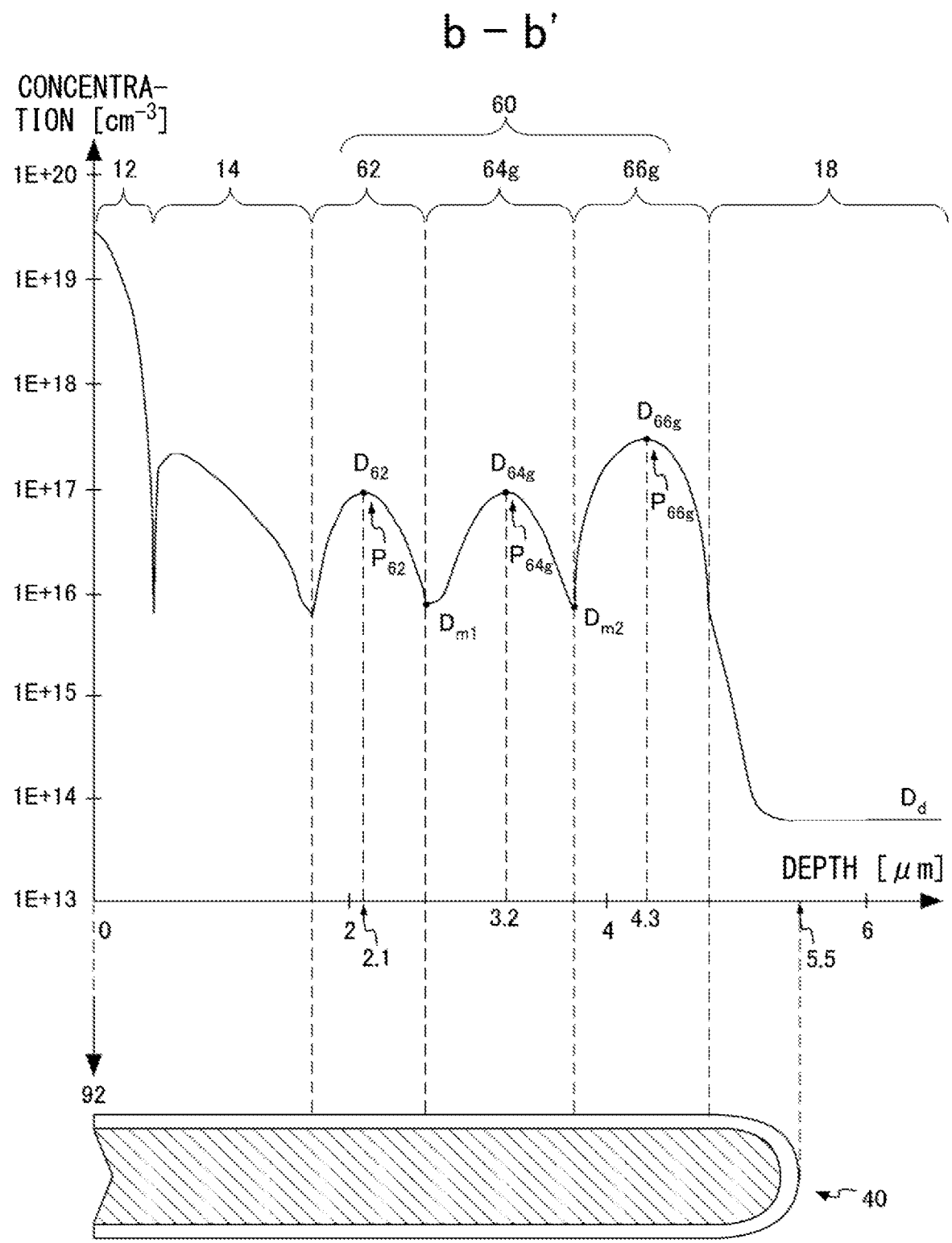
FIG. 3 is a view showing one example of doping concentration distributions in a section b-b' in FIG. 2.

FIG. 3 is a view showing one example of doping concentration distributions in a section b-b' in FIG. 2. The section b-b' is the section that passes through the upper accumulation area 62, the gate vicinity area 64g and the gate vicinity area 66g to be in parallel to the depth direction. In FIG. 3, there is shown a doping concentration distribution from the emitter region 12 in the transistor section 70 to the lower end vicinity of the gate trench section 40.

In FIG. 3, the vertical axis indicates a concentration of impurities. Note that the vertical axis is a logarithmic axis, and the concentration is ten times higher by an increase of one graduation thereof. As used herein, a doping concentration refers to a concentration of impurities transformed to donors or acceptors. That is, the doping concentration as used herein corresponds to a difference of concentration of the donors and acceptors (that is, meaning a net doping concentration).

Each of the doping concentration distribution of the upper accumulation area 62, the gate vicinity area 64g and the gate vicinity area 66g has a peak in the depth direction. In the present example, it is assumed that the number of the accumulation areas including multiple accumulation areas 60 is the number of the peaks of the doping concentrations. In the present example, the multiple accumulation areas 60 have three peaks.

As one example, a peak value $D_{62}$ of the doping concentration in the upper accumulation area 62 is the same as a peak value $D_{64g}$ of the doping concentration in the gate vicinity area 64g. The peak value $D_{64g}$ of the doping concentration in the gate vicinity area 64g is lower than a peak value $D_{66g}$ in the gate vicinity area 66g. In the present example, each doping concentration of the peak values $D_{62}$ and $D_{64g}$ is 1E+17 [cm$^{-3}$], and the doping concentration of the peak value $D_{66g}$ is 3E+17 [cm$^{-3}$]. Note that these peak values may have errors of ±10% or so. Note that the letter 'E' means powers of 10. For example, 1E+17 means 1.0× 10$^{17}$.

The peak position $P_{62}$ of the doping concentration in the upper accumulation area 62, the peak position $P_{64g}$ of the doping concentration in the gate vicinity area 64g and the peak position $P_{66g}$ of the doping concentration distribution in the gate vicinity area 66g may be arranged at equal intervals in the depth direction. Note that these peak positions may have errors of ±10% or so. In the present example, the upper surface 92 is defined as 0 [μm] in depth. In this case, the peak positions $P_{62}$, $P_{64g}$ and $P_{66g}$ are respectively 2.1 [μm], 3.2 [μm] and 4.3 [μm].

Each peak position P can be determined by an acceleration energy when N type impurities are ion implanted. The tail region of the doping concentration distribution that extends gently from each peak position in the depth direction may be formed by an annealing after the ion implantation.

It is desirable that in the multiple accumulation areas 60, the gate vicinity area 66g is provided in the lower end vicinity of the gate trench section 40 in the depth direction. In the present example, the configuration in which the gate vicinity area 66g is provided in the lower end vicinity of the gate trench section 40 means the one in which the peak position of the doping concentration of the gate vicinity area 66g is closer to the upper surface 92 by a predetermined length between 1 [μm] and 1.5 [μm] from the lower end of the gate trench section 40 in the depth direction. In the present example, $P_{66g}$ is closer to the upper surface 92 by 1.2 [μm] from the lower end of the gate trench section 40.

When the lower accumulation area 66 is provided in the lower end vicinity of the gate trench section 40, the degradation in breakdown voltage of the semiconductor device 100 can be suppressed, as compared to the case where the lower accumulation area 66 is provided closer to the lower surface 94 than the lower end vicinity of the gate trench section 40. For example, in the present example, the breakdown voltage can be improved, as compared to the case where the gate vicinity areas 64g and 66g are closer to the upper accumulation area 62 than those in the example of FIG. 3. Also, for example, in the present example, the breakdown voltage can be improved, as compared to the case where only the upper accumulation area 62 and the gate vicinity areas 64g are provided. Note that in addition to the case where the upper accumulation area 62 and the gate vicinity areas 64g and 66g are provided, the effect by the improvement of the breakdown voltage can also be obtained in the case where the upper accumulation area 62 and the gate vicinity area 66g are provided.

The doping concentration in the region between the upper accumulation area 62 and the gate vicinity area 64g, and the doping concentration in the region between the gate vicinity area 64g and the gate vicinity area 66g each may be higher than the doping concentration $D_d$ of the drift region 18. That is, a local minimum value $D_{m1}$ of the doping concentration distribution at the boundary between the upper accumulation area 62 and the gate vicinity area 64g may be the same as the doping concentration $D_d$ of the drift region 18 or larger than the $D_d$. Similarly, a local minimum value $D_{m2}$ of the doping concentration distribution at the boundary between the gate vicinity area 64g and the gate vicinity area 66g may also be the same as the doping concentration $D_d$ of the drift region 18 or larger than the $D_d$. Each of the peak values $D_{62}$, $D_{64g}$ and $D_{66g}$ may be ten times or more the local minimum value $D_{m1}$ or $D_{m2}$, and may be one hundred times or more thereof.

Figure 4:
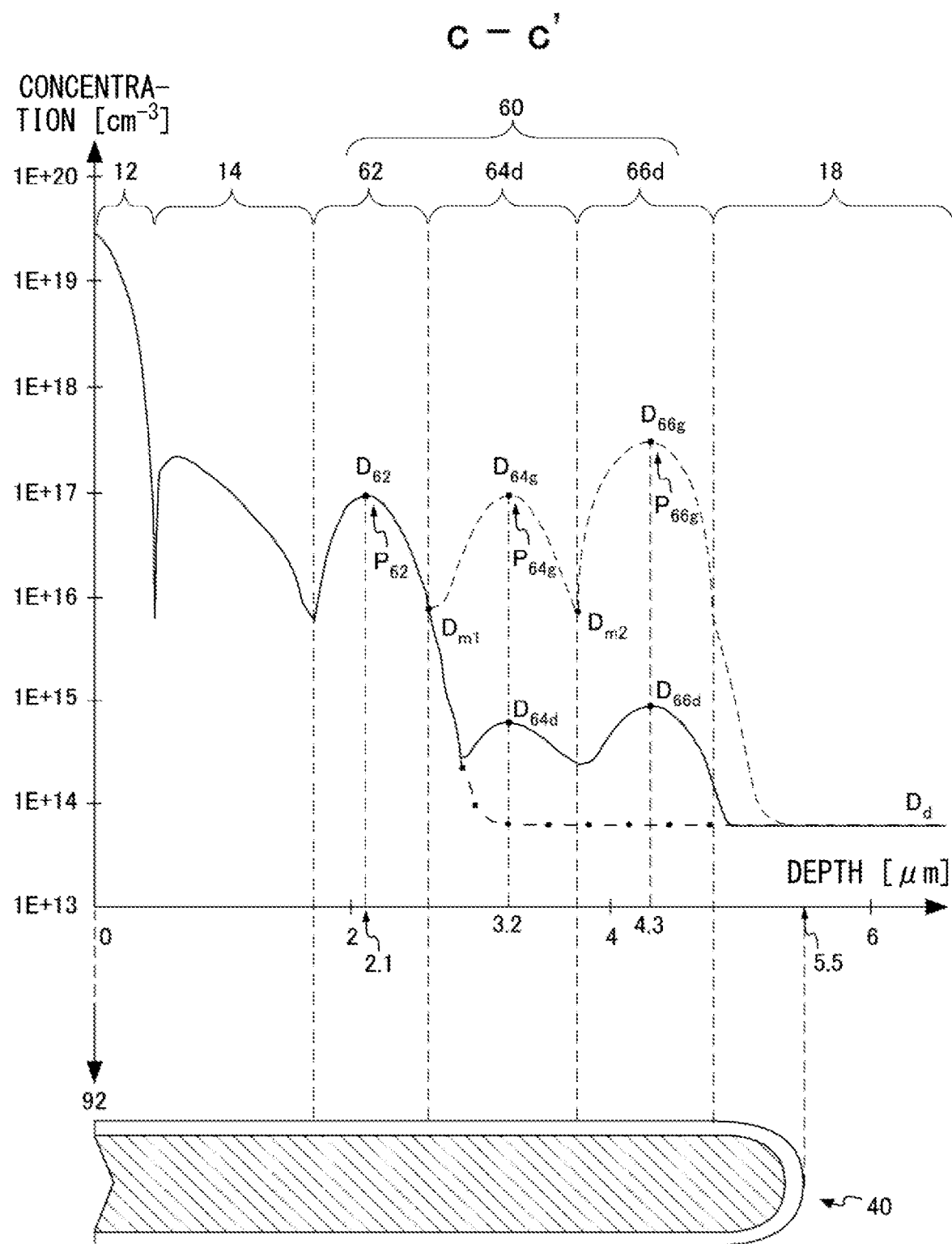
FIG. 4 is a view showing one example of doping concentration distributions in a section c-c' in FIG. 2.

FIG. 4 is a view showing one example of doping concentration distributions in a section c-c' in FIG. 2. The section c-c' is the section that passes through the upper accumulation area 62, the dummy vicinity area 64d and the dummy vicinity area 66d to be in parallel to the depth direction. In FIG. 4, there is shown a doping concentration distribution from the emitter region 12 in the transistor section 70 to the lower end vicinity of the gate trench section 40. Since the vertical axis and the horizontal axis are the same as those of FIG. 3, these descriptions will be omitted. The doping concentration distribution in the section c-c' is shown by a solid line. Note that the doping concentration distribution in the section b-b' of FIG. 3 is shown by a dashed line for reference.

In the present example, a difference from the example of FIG. 3 is that each of the dummy vicinity areas 64d and 66d has an N type doping concentration lower than the peak value $D_{62}$. Each of the dummy vicinity areas 64d and 66d may have an N type doping concentration higher than the N type doping concentration $D_d$ in the drift region 18. Also, each of the dummy vicinity areas 64d and 66d may have an N type doping concentration lower than each of the peak concentrations $D_{64g}$ and $D_{66g}$ of the N type doping concentration of the gate vicinity areas 64g and 66g in the depth direction. In the present example, the peak concentrations $D_{64d}$ and $D_{66d}$ of the dummy vicinity areas 64d and 66d in the depth direction each have an N type doping concentration lower than each of the local minimum values $D_{m1}$ and $D_{m2}$. The respective positions of the peak concentrations $D_{64d}$ and $D_{66d}$ may be the same as those of $P_{64g}$ and $P_{66g}$.

The peak concentrations $D_{64d}$ and $D_{66d}$ of the dummy vicinity areas 64d and 66d each may have an N type doping concentration that is 1.2 times or more, 1.3 times or more, 1.4 times or more, or 1.5 times or more of the doping concentration $D_d$ of the drift region 18. The dummy vicinity areas 64d and 66d of the present example may also contribute to the IE effect, although the effect is smaller than that by the gate vicinity areas 64g and 66g.

Note that the doping concentration $D_d$ of the drift region 18 may be the doping concentration between the lower end of the gate trench section 40 and the buffer region 20 in the depth direction. The doping concentration $D_d$ of the drift region 18 is, for example, a net doping concentration at the intermediate position between the lower end of the gate trench section 40 and the buffer region 20 in the depth direction. The doping concentration $D_d$ of the drift region 18 may be an average value of the doping concentration in a predetermined depth range. In one example, the doping concentration $D_d$ of the drift region 18 may be an average value of the doping concentration from the position that is lowered by 1 μm from the lower end of the gate trench section 40 to the position that is raised by 1 μm from the boundary between the drift region 18 and the buffer region 20.

Instead of this, in another example, the dummy vicinity areas 64d and 66d each may have an N type doping concentration that is the same as the N type doping concentration in the drift region 18. In this case, the doping concentration distribution of the dummy vicinity areas 64d and 66d is shown by an alternate long and short dash line. In this case, the intermediate accumulation area 64 and the lower accumulation area 66 may be configured by the gate vicinity areas 64g and 66g.

Figure 5:
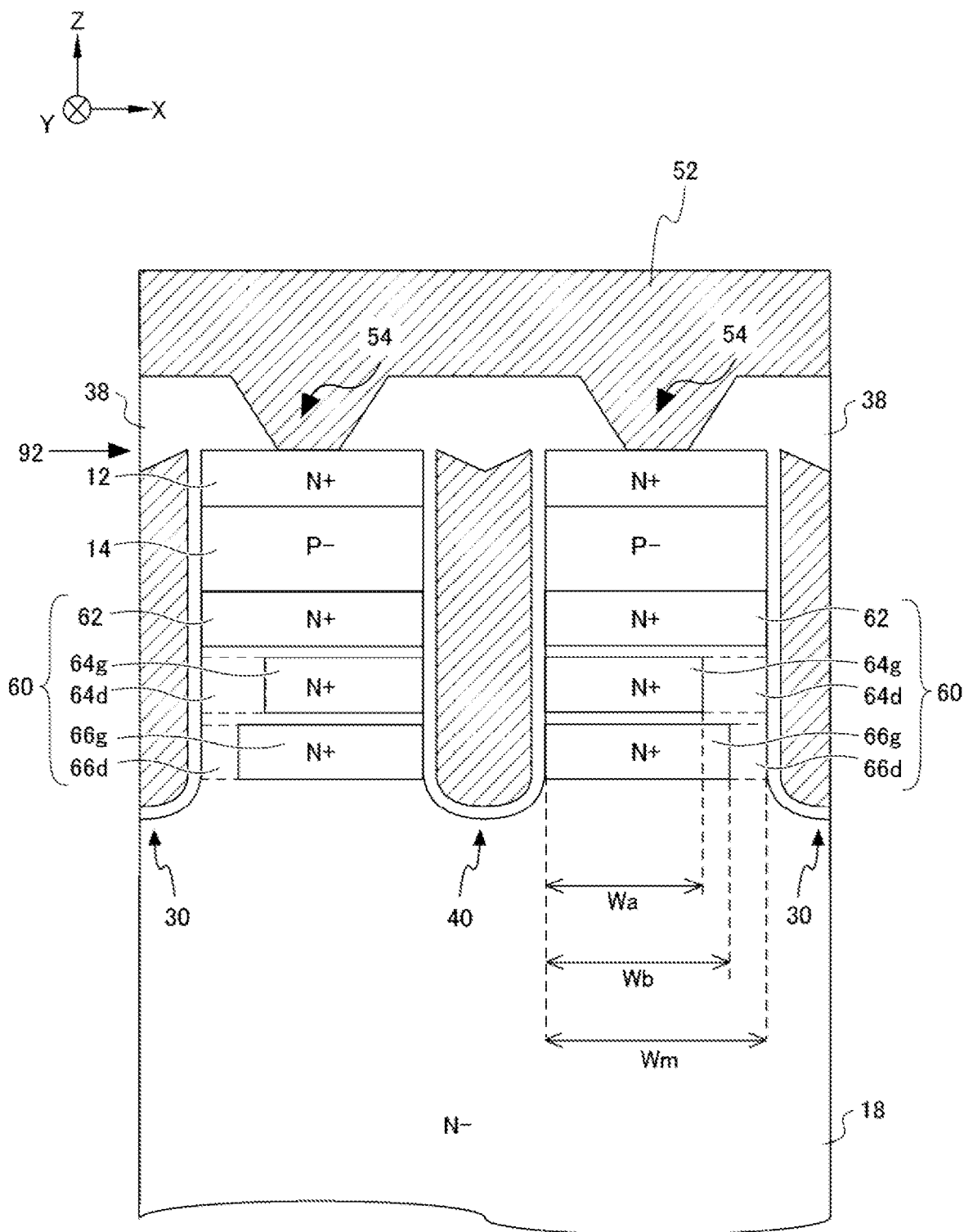
FIG. 5 is an enlarged view in the vicinity of a gate trench section 40 in FIG. 2.

FIG. 5 is an enlarged view in the vicinity of the gate trench section 40 in FIG. 2. In the present example, the length Wa of the gate vicinity area 64g in the arrangement direction is shorter than the length Wb of the gate vicinity area 66g in the arrangement direction (Wa<Wb). However, in another example, Wb<Wa may be allowed. Also, the length Wb is shorter than the shortest distance Wm between the gate trench section 40 and the dummy trench section 30 in the arrangement direction (Wb<Wm). Wa and Wm may satisfy an expression: 0.55≤Wa/Wm≤0.95. Also, Wb and Wm may satisfy an expression: 0.7<Wb/Wm<1. The gate vicinity areas 64g and 66g may be separated from the dummy trench section 30. Note that Wm may be provided between 0.4 [μm] and 1.8 [μm].

Figure 6A:
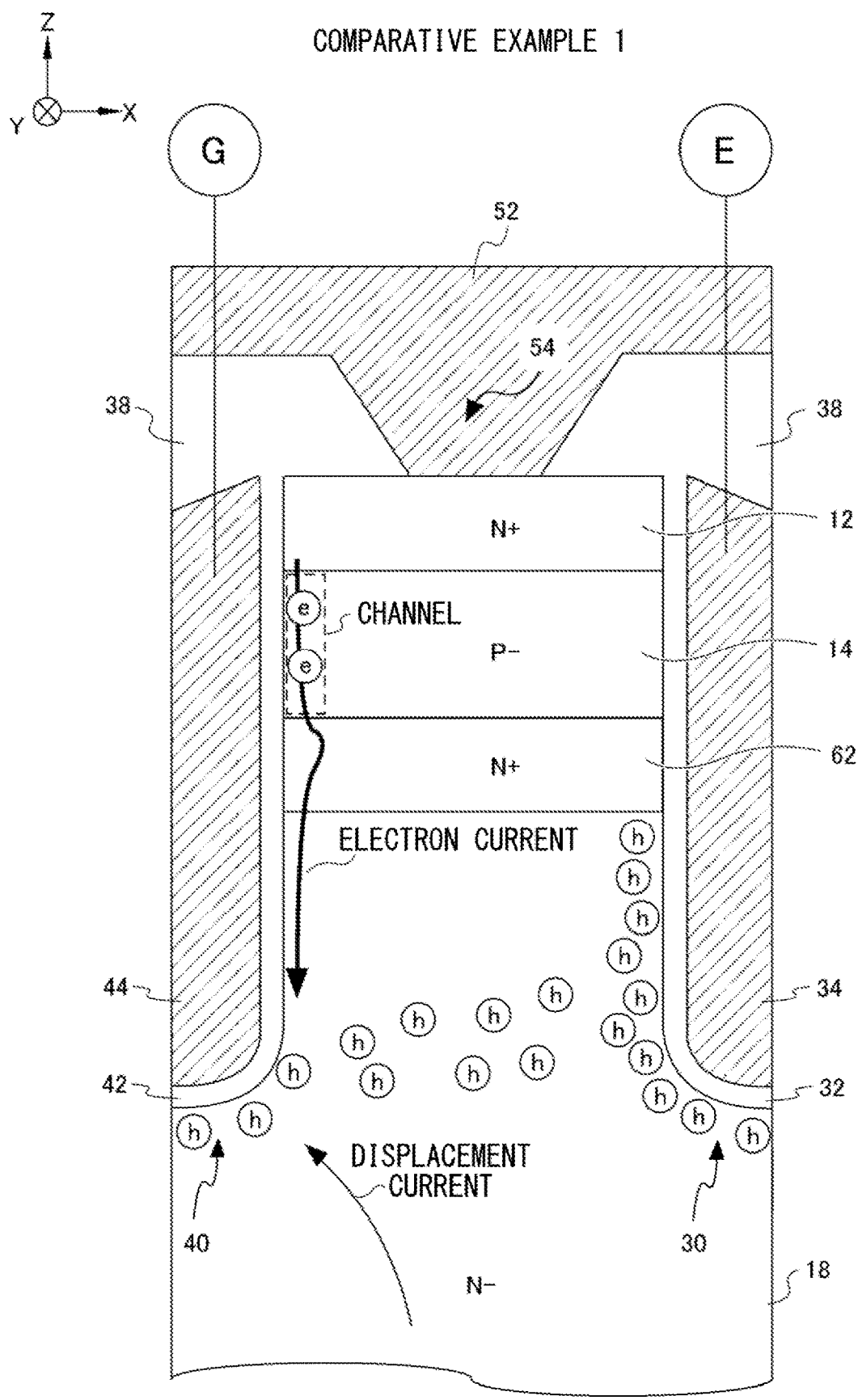
FIG. 6A is a view showing an electron current and a displacement current during a low-current turn-on in Comparative Example 1 having only an upper accumulation area 62.

FIG. 6A is a view showing an electron current and a displacement current during the low-current turn-on in Comparative Example 1 having only the upper accumulation area 62. In FIG. 6A, in consideration of viewability of the drawing, only the vicinity of one pair of trench sections in FIG. 5 is shown. During the low-current turn-on, the voltage of the gate conductive section 44 is gradually raised from 0[V]. Thereby, a negative charge is induced in the vicinity of the gate trench section 40 in the base region 14, so that a channel is formed.

The majority of the current at an early stage during the low-current turn-on is not a hole current, but the electron current. The early stage refers to a period from a time immediately before the gate voltage Vge reaches a threshold voltage to a time that enters a mirror period at which Vge becomes constant at the value of almost the threshold voltage. As the Vge comes closer to the threshold voltage, opening of the channel is started, and injection of electrons into the drift region is started. In Comparative Example 1 of FIG. 6A, there is a possibility that the electrons that travel downward from the channel is liable to travel once in the arrangement direction (X direction) in the upper accumulation area 62. Note that in the drift region 18 under the upper accumulation area 62, the accumulation layer of the electrons has been already formed in the vicinity of the gate trench section 40 (the threshold voltage in which the accumulation layer of the electrons is formed in the N type region is by far smaller than the threshold voltage of an inversion layer in the P type region), thus having a lower impedance than that of the drift region 18. Therefore, the electron current flows mainly in the vicinity of the gate trench section 40.

When the electrons reach the collector region on the backside, injection of holes is started from the collector region to the buffer region and the drift region. In Comparative Example 1 of FIG. 6A, the inventor in the present case confirmed by simulation that the holes exist on the order of 1E+16 [cm$^{-3}$] from the lower end vicinity of the gate trench section 40 to the side portion of the dummy trench section 30 located under the upper accumulation area 62. The holes are concentrated at the respective lower ends of the gate trench section 40 and the dummy trench section 30. Since in particular, the dummy conductive section 34 has the same potential as that of the emitter electrode 52, the inversion layer of the holes is formed at the sidewall of the dummy trench section 30. The holes injected from the collector region are concentrated on the vicinity of the inversion layer of the holes. The holes are accumulated from the dummy trench section 30 to the lower end of the gate trench section 40. Due to this hole distribution, a larger displacement current as compared to the example in FIG. 6B described later flows to the lower end vicinity of the gate trench section 40 during the low-current turn-on.

The displacement current due to the accumulation of the holes causes the chargings of the gate conductive sections 44 facing each other across the gate insulating film. The chargings of the gate conductive sections 44 causes a momentary increase of a gate electrode Vge. As that displacement current is larger, the gate conductive section 44 is charged faster, so that the potential of the gate conductive section 44 is raised more quickly. As a result, the potential of the gate conductive section 44 will exceed momentarily a gate threshold. Thereby, a large amount of injection of the electrons and the holes is started, so that a current between collector and emitter is increased. The voltage reduction rate (dV/dt) of the voltage between collector and emitter is increased according to the current change rate by the increase of the current between collector and emitter. As the displacement current is larger, the dV/dt becomes larger. In particular, as the accumulated holes flow less in the emitter electrode, the displacement current becomes larger, so that the momentary increase in potential of the gate conductive section 44 becomes larger. Therefore, in Comparative Example 1 in FIG. 6A, the dV/dt becomes relatively larger, and the electromagnetic noise also becomes relatively larger.

Figure 6B:
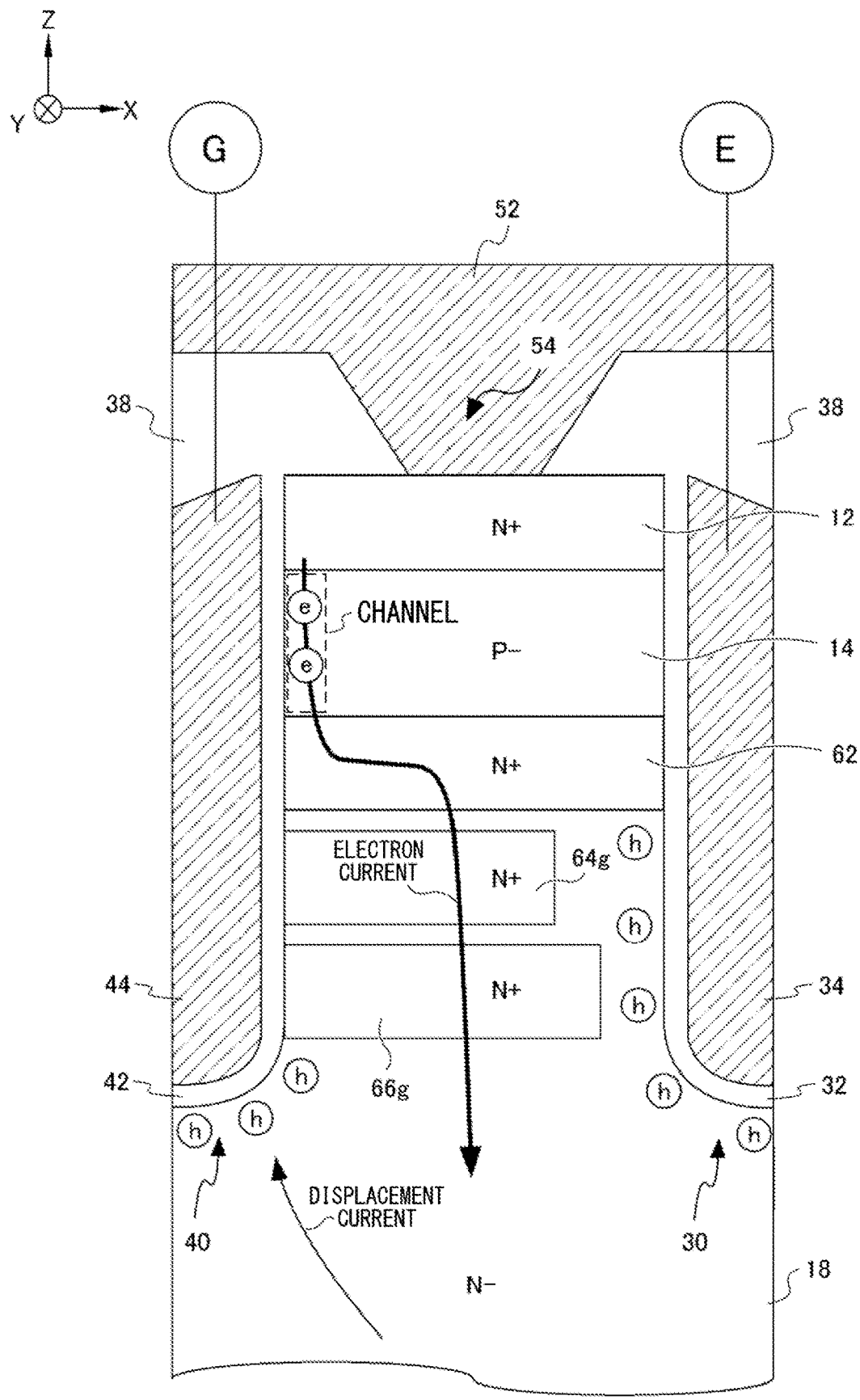
FIG. 6B is a view showing the electron current and the displacement current during the low-current turn-on in the present example.

FIG. 6B is a view showing the electron current and the displacement current during the low-current turn-on in the present example. Also in FIG. 6B, only the vicinity of only the one pair of trench sections in FIG. 5 is shown. Also in the present example, the electrons are liable to travel in the arrangement direction (X direction) in the upper accumulation area 62. However, in the present example, the intermediate accumulation area 64 and the lower accumulation area 66 are provided under the upper accumulation area 62. In the present example, the impedance for the electron current is lower in the case where it travels from the upper accumulation area 62 to the intermediate accumulation area 64 and the lower accumulation area 66, than the case where it returns to the vicinity of the gate trench section 40 again. Therefore, the electron current of the present example does not return to the vicinity of the gate trench section 40, but travels downward in the central vicinity of the mesa sandwiched between the gate trench section 40 and the dummy trench section 30. That is, the electron current of the present example flows in the central vicinity of the mesa, not in the vicinity of the gate trench section 40. An effect where this electron current flows in the central vicinity of the mesa cannot be produced by an accumulation area with only a single layer, which cannot be predicted. That is, the effect is the one to be obtained for the first time in the case where the multiple accumulation areas 60 of the present example are involved.

When the electron current flows in the central vicinity of the mesa, the holes are divided into parts at the central vicinity of the mesa, and forced to flow toward either of the gate trench section 40 side or the dummy trench section 30 side. This division of the holes at the mesa central portion suppresses the accumulation of the holes at the lower end of the gate trench section 40. As a result, the displacement current can be made smaller as compared to the example of FIG. 6A. Since the displacement current can be made smaller, the charging of the gate conductive section 44 becomes smaller, so that a momentary increase of the gate electrode Vge can also be suppressed. Thereby, the voltage reduction rate (dV/dt) in the voltage between collector and emitter can also be suppressed.

The inventor in the present case confirmed by simulation that the holes are mainly distributed at the lower end of the gate trench section 40, and at the lower end and the side portion of the dummy trench section 30, but hardly distributed at the mesa central portion. The holes exist on the order of 1E+13 [cm$^{-3}$] in the lower end vicinity of the gate trench section 40 and the lower end vicinity of the dummy trench section 30, so that it is sufficiently lower than 1E+16 [cm$^{-3}$] in Comparative Example 1 of FIG. 6A. Although it is not limited to the following reason, it is considered that the hole distribution in the present example of FIG. 6B is due to a fact in which the holes between the gate trench section 40 and the dummy trench section 30 are divided into parts by the electron current. Also, due to that hole distribution, during the low-current turn-on, the displacement current smaller than that of Comparative Example 1 in FIG. 6A flows from the lower end vicinity of the dummy trench section 30 to the lower end vicinity of the gate trench section 40.

Therefore, since in the present example, the displacement current is smaller than that of Comparative Example 1 in FIG. 6A, dV/dt becomes smaller than that of Comparative Example 1 in FIG. 6A, and the electromagnetic noise can also be made smaller. Also, in the present example, for the purpose of suppression of a quick increase in the potential of the gate conductive section 44, an additional gate resistance Rg may not be provided in the gate conductive section 44, or may be a sufficiently small Rg. Therefore, it is also advantageous that the electric power loss during the turn-on can be reduced as compared to Comparative Example 1 of FIG. 6A.

In addition, in the present example, the gate vicinity areas 64g and 66g are not in direct contact with the dummy trench section 30. Therefore, the holes can exist from the lower end of the dummy trench section 30 to the portion immediately under the upper accumulation area 62 at the side portion of the dummy trench section 30. Thereby, the holes can be pulled in to the vicinity of the upper surface 92, as compared to the case where the gate vicinity areas 64g and 66g are in direct contact with the dummy trench section 30. Therefore, during a turn-off, the holes accumulating in the vicinity of the dummy trench section 30 can be pulled out more from the P+ type contact region 15.

That is, in the present example, as compared to the case where the gate vicinity areas 64g and 66g are in direct contact with the dummy trench section 30, the holes accumulating in the vicinity of the dummy trench section 30 associated with the turn-on and turn-off can be reduced. Thereby, the division of the holes at the mesa central portion can be facilitated, and a momentary increase of the gate voltage Vge can be further suppressed. Also, a trade-off characteristic between the on-voltage and the turn-off loss of the IGBT can be improved.

Figure 6C:
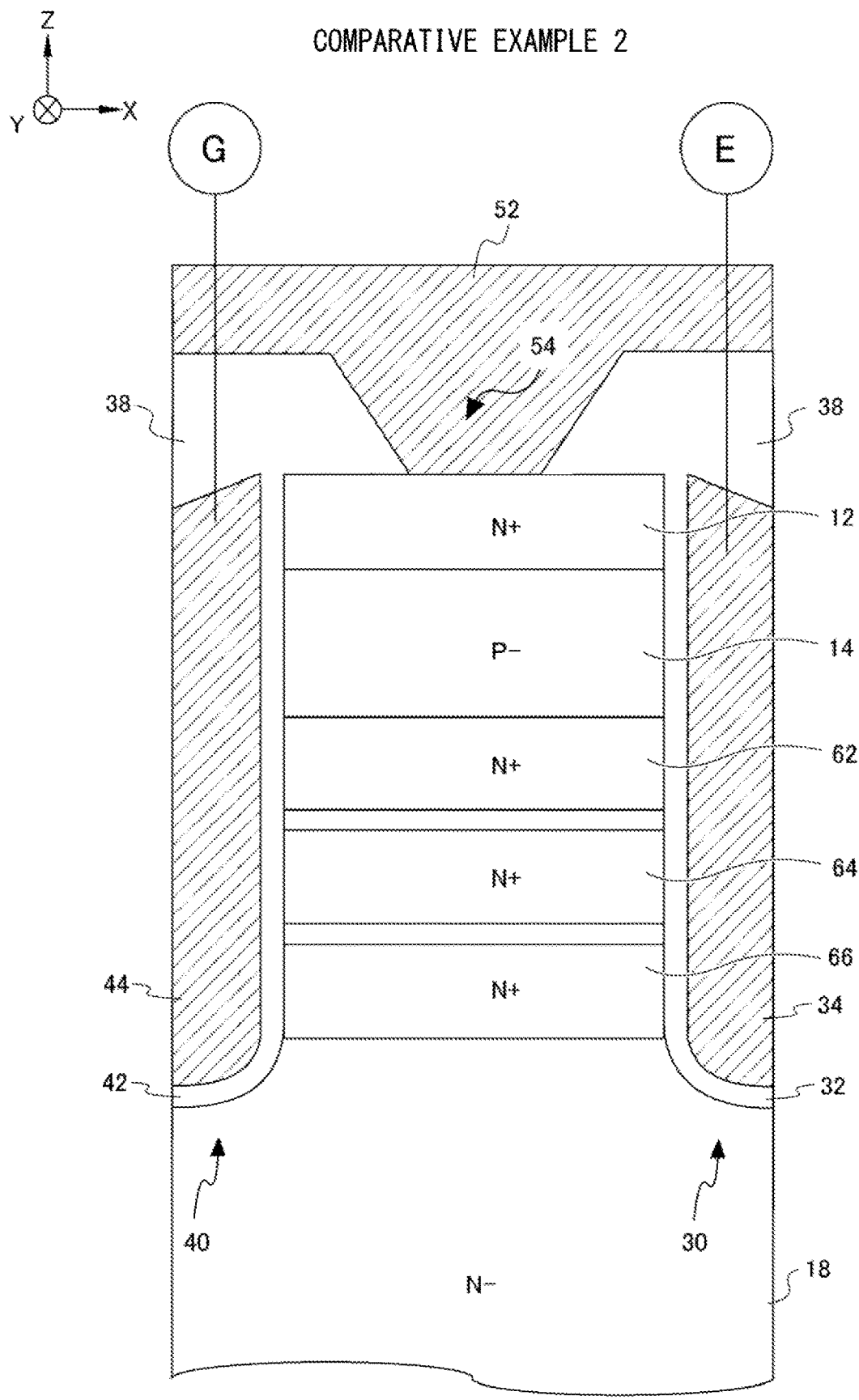
FIG. 6C is a view showing Comparative Example 2 having multiple accumulation areas 60.

FIG. 6C is a view showing Comparative Example 2 having multiple accumulation areas 60. In FIG. 6C, only the structure in the vicinity of only the one pair of trench sections in FIG. 5 is shown. Similarly to the example of FIG. 6B, Comparative Example 2 in FIG. 6C has the upper accumulation area 62, the intermediate accumulation area 64 and the lower accumulation area 66. Note that both the intermediate accumulation area 64 and the lower accumulation area 66 of Comparative Example 2 extend from the gate trench section 40 to the dummy trench section 30. That is, the intermediate accumulation area 64 and the lower accumulation area 66 in Comparative Example 2 do not have the dummy vicinity areas 64d and 66d.

Figure 7:
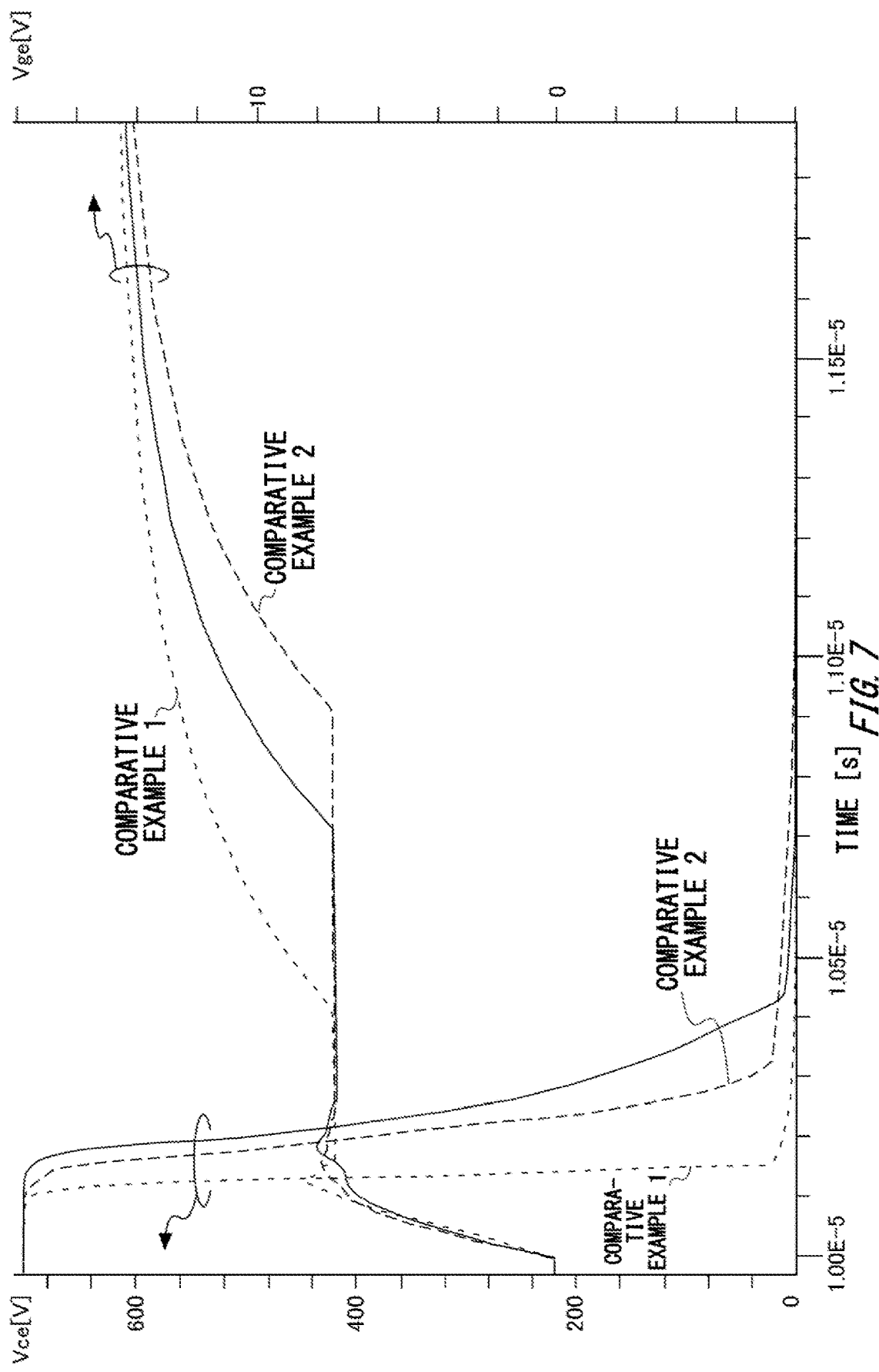

FIG. 7 is a view showing simulations of Vge and Vce during the low-current turn-on. Vge is a potential difference between the gate metal layer 50 and the emitter electrode 52, and Vce is a potential difference between the collector electrode 24 and the emitter electrode 52. Vge and Vce in Comparative Example 1 of FIG. 6A is shown by dashed lines, and Vge and Vce in the present example of FIG. 6B is shown by a solid line. Further, Comparative Example 2 of FIG. 6C (an example in which high concentration areas at multiple stages are connected to the dummy trench section 30) is shown by a dashed line. The left side of the vertical axis indicates Vce [V], and the right side of the vertical axis indicates Vge [V]. The horizontal axis indicates time [s].

As shown in FIG. 7, in Comparative Example 1 of FIG. 6A and the present example of FIG. 6B, a positive potential was applied to the gate metal layer 50 at a time 1E−5 [s]. The Vge in Comparative Example 1 of FIG. 6A was raised to around 8.6 [V] once, and then settled to about 7 [V] by a time1.03E−5 [s]. Hereinafter, a matter that the Vge is momentarily increased in this manner will be referred to as 'momentary increase (rapid spike).' On the other hand, the magnitude (absolute value) of the voltage reduction rate (dV/dt) of Vce was about 14000 [V/µs], and almost maintained to about 14000 [V/µs] up to the time when the voltage is below 40 [V]. Thereafter, the Vge in Comparative Example 1 of FIG. 6A was maintained at 7 [V] to a time 1.04E−5 [s], and the potential was gradually raised after the time 1.04E−5 [s]. Note that a period at which Vge was the constant value at about 7 [V] is referred to as 'mirror period.'

The Vge in the present example of FIG. 6B was once raised to around 8.1 [V] lower by 0.5 [V] than that of Comparative Example 1, and then settled to about 7 [V] by the time1.03E−5 [s]. On the other hand, the dV/dt of the Vce was about 5800 [V/µs] around from about 1.028E−5 [s] at which the voltage starts falling down at the maximum reduction rate. Further subsequently, the magnitude of the dV/dt was reduced, and reduced to about 1200 [V/µs] at the time of 200 [V] or less in the voltage. This value was one-tenth or less that of Comparative Example 1.

With respect to Comparative Example 2 of FIG. 6C, similarly to the present example of FIG. 6B, main differences were as follows: the Vge peak value of the gate voltage during the rapid spike was 7.8 [V] lower by 0.3 [V] than that in the present example of FIG. 6B; and the dV/dt of 200 [V] or less in the voltage was about 1600 [V/µs].

After a positive potential was applied to the gate metal layer 50, a conductivity modulation was generated in the drift region 18, so that the Vce was gradually dropped. In the Vce in Comparative Example 1 of FIG. 6A, the potential was dropped rapidly from a time 1.01E−5 [s] to a time 1.015E−5 [s]. In contrast, in the present example of FIG. 6B, the potential was dropped from the time 1.015E−5 [s] to a time 1.045E−5 [s]. That is, in the present example of FIG. 6B, the potential was dropped slowly by taking three times the time as compared to FIG. 6A. In this manner, in the present example, the dV/dt during the low-current turn-on could be suppressed.

Note that the mirror periods in the present example and Comparative Example 2 each were longer than that of Comparative Example 1 by two times or more. However, this is adjustable by a gate resistance. That is, in the present example and Comparative Example 2, the dV/dt was lowered to be one-tenth or near that of Comparative Example 1; thus, when the gate resistance is made smaller by that amount, the mirror period becomes shorter.

In the present example in FIG. 6B, it is advantageous that the trade-off between the on-voltage and the turn-off loss is better than that of Comparative Example 2 of FIG. 6C. In Comparative Example 2 of FIG. 6C, the on-voltage is made lower than that in the present example of FIG. 6B, but the turn-off loss is made higher than that in the present example of FIG. 6B. When the on-voltage and the turn-off loss are considered in a comprehensive manner, the present example of FIG. 6B is superior to that in Comparative Example 2 of FIG. 6C.

Figure 8:
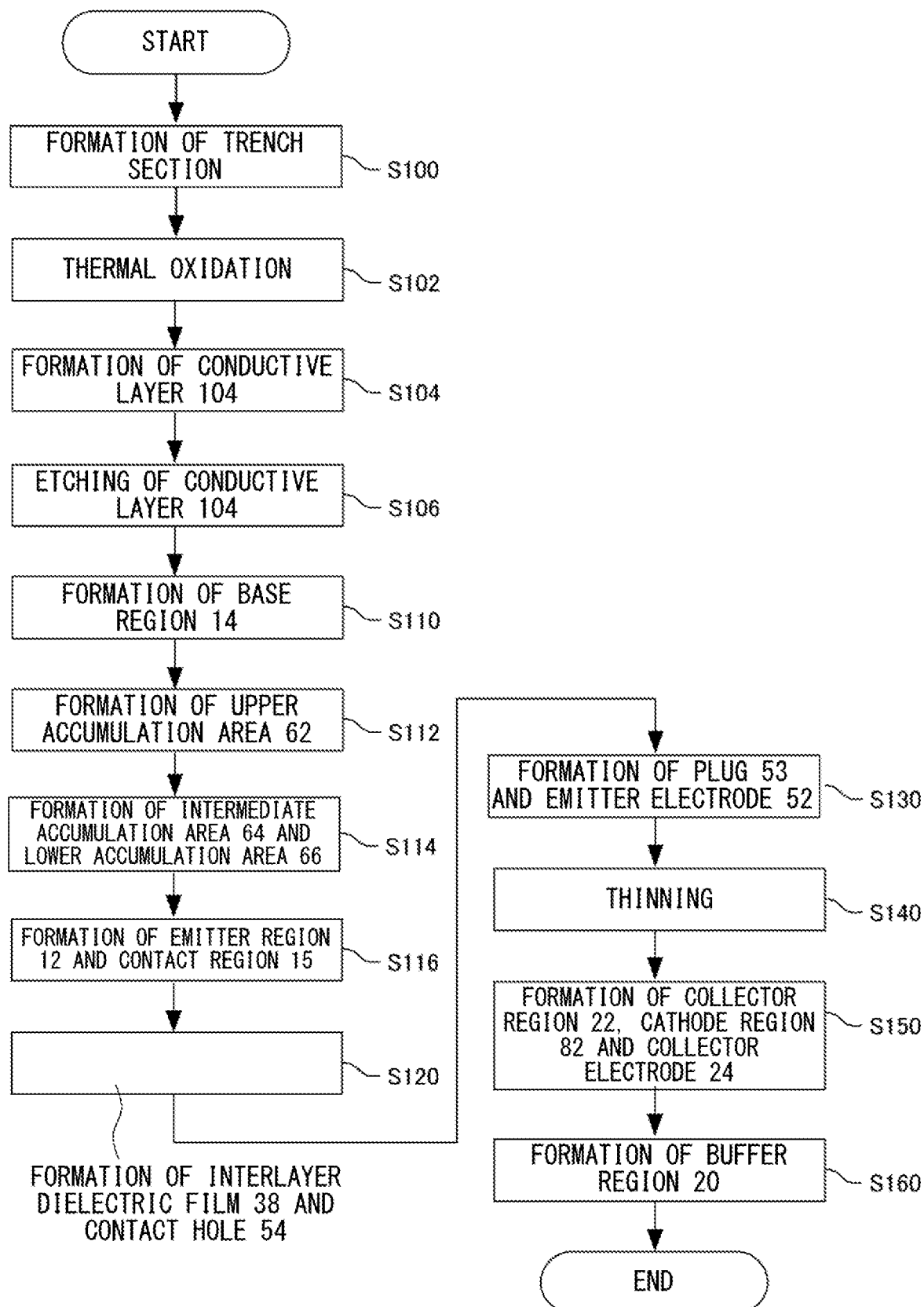
FIG. 8 is a flow chart showing one example of a manufacturing method of the semiconductor device 100.

FIG. 8 is a flowchart showing one example of a manufacturing method of the semiconductor device 100. In the present example, individual steps are carried out in the order from step S100 to step S160 (that is, in ascending order of the number).

Figure 9:
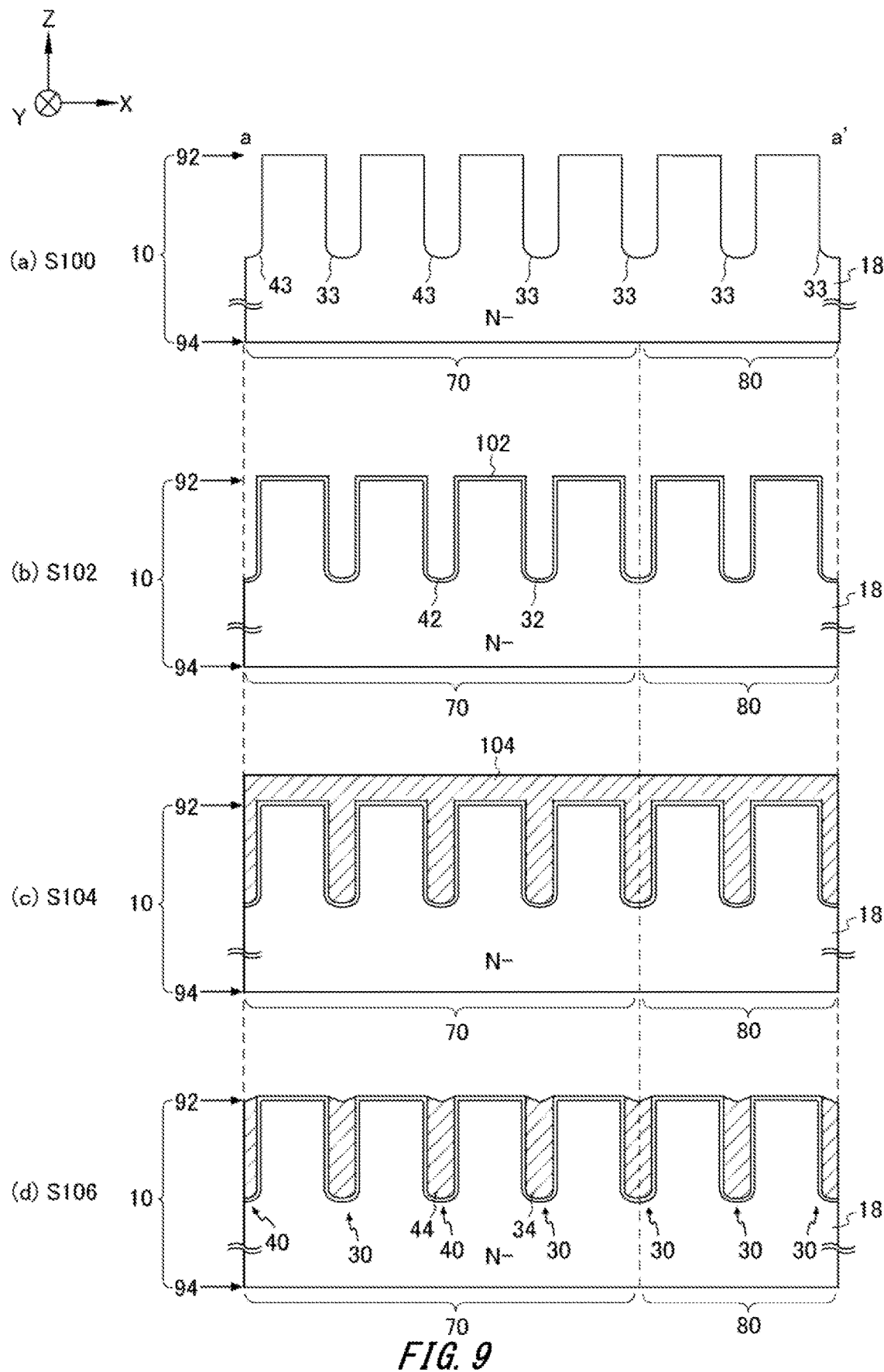
FIG. 9 includes views showing step S100 to step S106.

FIG. 9 includes views showing step S100 to step S106. (a) in FIG. 9 shows step S100 that forms the trenches having the dummy trench 33 and the gate trench 43 in the semiconductor substrate 10. The semiconductor substrate 10 may be the substrate having an N− type drift region 18 as an impurity region. In step S100, the trenches may be formed by selectively etching the upper surface 92 of the semiconductor substrate 10 by use of a mask material (not shown). Note that a line segment a-a' in the figure means that (a) in FIG. 9 shows the same section as that of FIG. 2. Also, wave lines in the figure mean that the length between the upper surface 92 and the lower surface 94 is omitted.

(b) in FIG. 9 shows step S102 that thermally oxidizes the semiconductor substrate 10. The thermally oxidized film 102 may be formed on the whole surface of the semiconductor substrate 10. In step S102, it may be formed at least on the upper surface 92 and inside the trenches. Since the semiconductor substrate 10 of the present example is a silicon substrate, the thermally oxidized film 102 is a silicon oxide film. The silicon oxide film to be formed in contact with the gate trench 43 may be considered as the gate insulating film 42, and the silicon oxide film to be formed in contact with the dummy trench 33 may be considered as the dummy trench insulating film 32.

(c) in FIG. 9 shows step S104 that forms a conductive layer 104 on the semiconductor substrate 10. The conductive layer 104 may be formed to be in contact with the upper surface 92 and the thermally oxidized film 102 inside the trench. The conductive layer 104 may be formed by chemical vapor deposition (CVD). The conductive layer 104 of the present example is a polysilicon layer doped with impurities.

(d) in FIG. 9 shows step S106 that etches the conductive layer 104. In the etching of step S106, the thermally oxidized film 102 may serve as an etching stopper. By that etching, the conductive layer 104 located on the upper surface 92 may be removed. Note that the upper portion of the conductive layer 104 located inside the trench section may be recessed through the etching of step S106. In the present example, each upper portion of the dummy conductive section 34 and the gate conductive section 44 has a V-shape in a sectional view of (d) in FIG. 9. Thereby, the gate trench section 40 and the dummy trench section 30 are formed.

Figure 10:
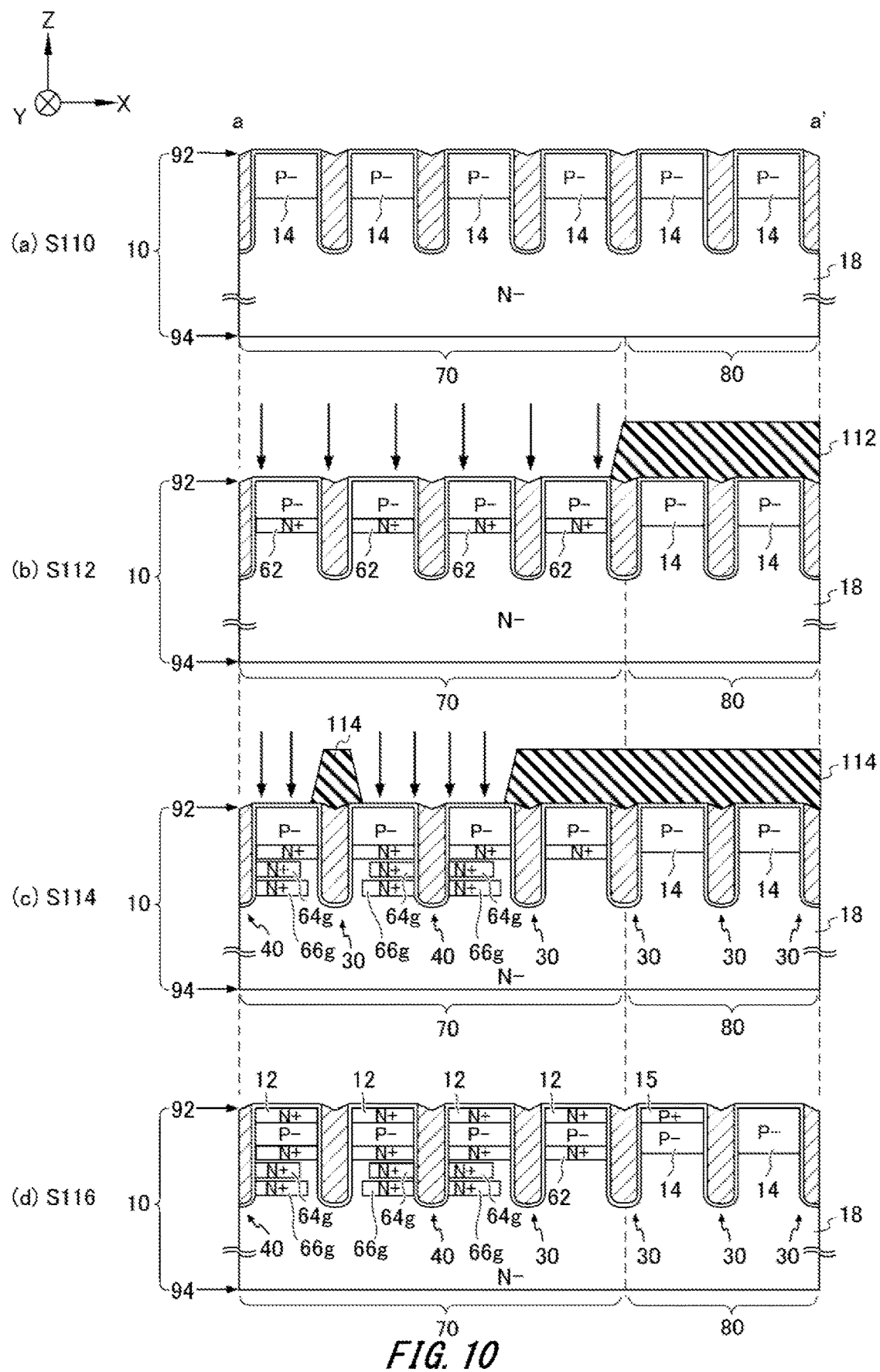
FIG. 10 includes views showing step S110 to step S116.

FIG. 10 includes views showing step S110 to step S116. (a) in FIG. 10 shows step S110 that forms the base region 14. In step S110, after P type impurities are ion implanted on the whole upper surface 92, the semiconductor substrate 10 is subjected to an annealing. The ion implanted P type impurities are diffused and activated by the annealing. Also, the crystallinity of the semiconductor substrate 10 destructed by the ion implantation may be recovered to some extent by the annealing. The annealing may be performed for about three hours at about 1150 degrees C.

(b) in FIG. 10 shows step S112 that forms the upper accumulation area 62. In the present example, the upper accumulation area 62 is not provided in the diode section 80. Then, a mask material 112 is provided over the diode section 80. In contrast, the mask material 112 is not provided over the transistor section 70. In this manner, when the mask material 112 is selectively provided, and N type impurities are ion implanted from the upper surface 92, the N type impurities can be ion implanted over a predetermined depth range in the transistor section 70. At step S112, protons or phosphorus may be ion implanted. Since protons are ion implanted in the present example, hydrogen may exist as the N type impurities in the upper accumulation area 62. The mask material 112 may be formed of a photoresist.

(c) in FIG. 10 shows step S114 that forms the intermediate accumulation area 64 and the lower accumulation area 66 in sequence. Note that either of the intermediate accumulation area 64 and the lower accumulation area 66 may be formed in advance. In one example, the N type impurities may be ion implanted at the depth position corresponding to the intermediate accumulation area 64, and then the N type impurities may be ion implanted at the depth position corresponding to the lower accumulation area 66. Also, in another example, the N type impurities may be ion implanted at the depth position corresponding to the lower accumulation area 66, and then the N type impurities may be ion implanted at the depth position corresponding to the intermediate accumulation area 64.

At step S114, in addition to the upper portion of the diode section 80, the mask material 114 is provided in the upper portion of the dummy trench section 30 in the transistor section 70. In this manner, in the state where the mask material 114 is selectively provided, the N type impurities are ion implanted. The mask material 114 may also be formed by the photoresist.

At step S114, the ion implantations may be performed by a plurality of times at different ranges for the impurities to be ion implanted. In the present example, protons are ion implanted at different depths of the semiconductor substrate 10. Protons can be implanted to a deeper position as compared to phosphorus ions or the like, and also has a small variation at the implanted position. When the intermediate accumulation area 64 and the lower accumulation area 66 located at a position deeper than that of the upper accumulation area 62 are formed of protons, the intermediate accumulation area 64 and the lower accumulation area 66 can be formed more readily, as compared to the case formed by phosphorus. In addition, in the case where protons are used as compared to the case where phosphorus is used, it is advantageous in that since the peak of the doping concentration distribution in the multiple accumulation areas 60 can be steeply formed, the multiple accumulation areas 60 having a narrow depth range can be readily formed.

(d) in FIG. 10 shows step S116 that forms the emitter region 12 and the contact region 15. In the present example, in the state where a mask material (not shown) having an opening at a position corresponding to the emitter region 12 is provided, the N type impurities are ion implanted from the upper surface 92. The N type impurities may be phosphorus. Also, in the state where a mask material (not shown) having an opening at a position corresponding to the contact region 15 is provided, P type impurities are ion implanted from the upper surface 92. The P type impurities may be boron or aluminum. Note that either of the ion implantation of the N type impurities for formation of the emitter region 12 and the ion implantation of the P type impurities for formation of the contact region 15 may be performed in advance. After that N type and P type impurities are ion implanted, the semiconductor substrate 10 may be subjected to the annealing. The annealing at step S116 may be the annealing at a lower temperature and for a shorter time as compared to the annealing in the formation of the base region 14 (step S110). For example, the annealing at step S116 is performed at about 1000 degrees C. for about 30 minutes.

Figure 11:
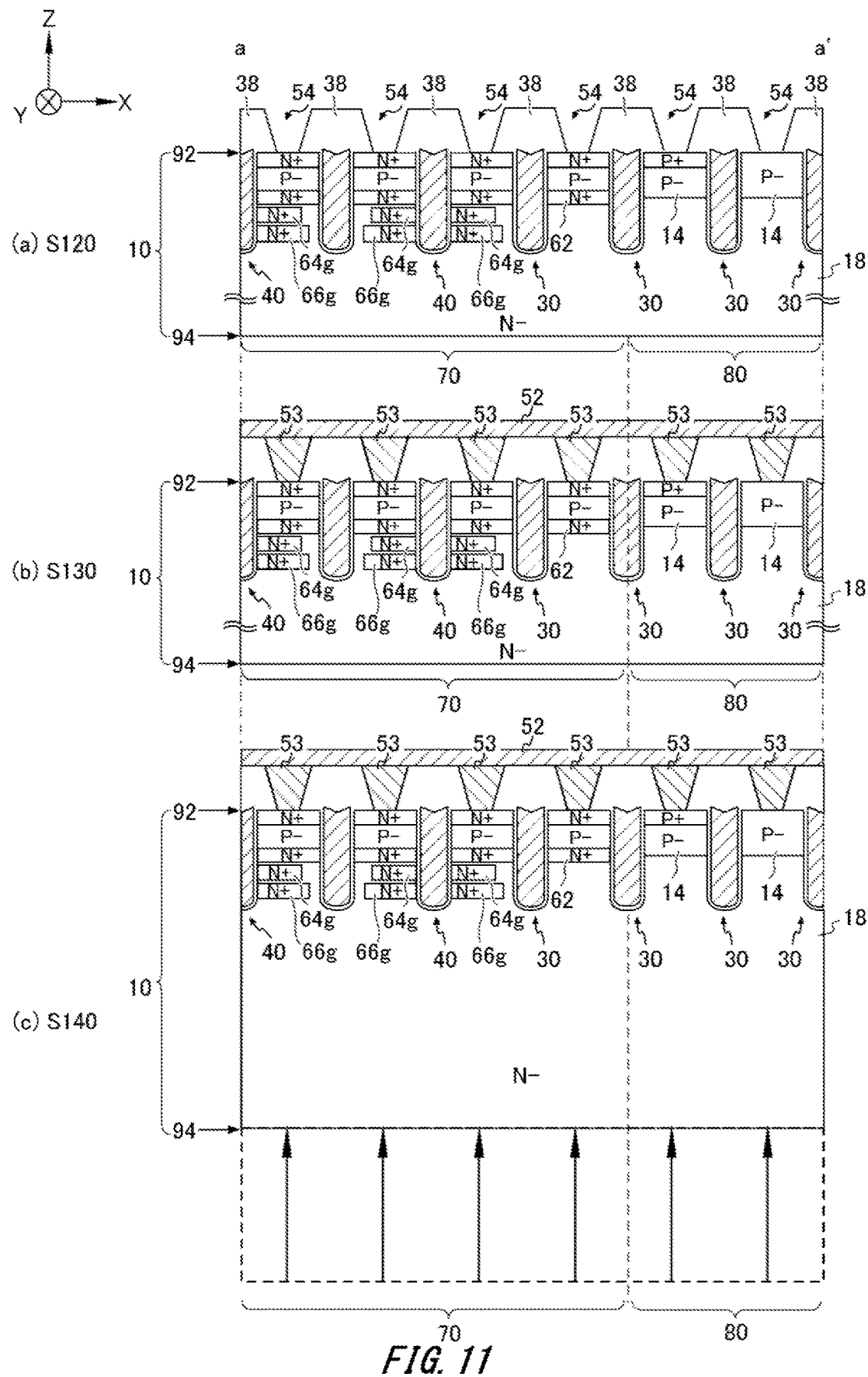
FIG. 11 includes views showing step S120 to step S140.

FIG. 11 includes views showing step S120 to step S140. (a) in FIG. 11 shows step S120 that forms the interlayer dielectric film 38 and the contact hole 54. The interlayer dielectric film 38 may be formed of BPSG, PSG or BSG. The contact hole 54 may be formed by selectively removing the interlayer dielectric film 38. Note that the thermally oxidized film 102 immediately under the contact hole 54 may be removed at step S120. Also, the contact hole 49, 56 and 58 may be formed at step S120.

(b) in FIG. 11 shows Step S130 that forms a plug 53 and the emitter electrode 52. The plug 53 and the emitter electrode 52 may be formed by sputtering. The plug 53 may be embedded in the contact hole 54 to be defined at the side portion of the interlayer dielectric film 38 and the upper surface 92. Note that as described in FIG. 2, the plug 53 may be lacking. The plug 53 may be a lamination structure composed of a barrier metal such as tungsten that is thinner than a thickness of the interlayer dielectric film 38 that is formed on the upper surface 92 of the semiconductor substrate 10 and on the sidewall of the interlayer dielectric film 38, and of a tungsten that is formed substantially flush with the upper surface of the interlayer dielectric film 38 when a concave portion defined by that barrier metal is embedded. The emitter electrode 52 may be provided uniformly on the plug 53 and the interlayer dielectric film 38. The emitter electrode 52 may be formed of aluminum or an alloy of aluminum-silicon.

(c) in FIG. 11 shows step S140 that thins the semiconductor substrate 10. At step S140, the lower surface 94 of the semiconductor substrate 10 is grinded to adjust the thickness of the semiconductor substrate 10. The thickness of the semiconductor substrate 10 may be set according to a breakdown voltage to be involved by the semiconductor device 100.

Figure 12:
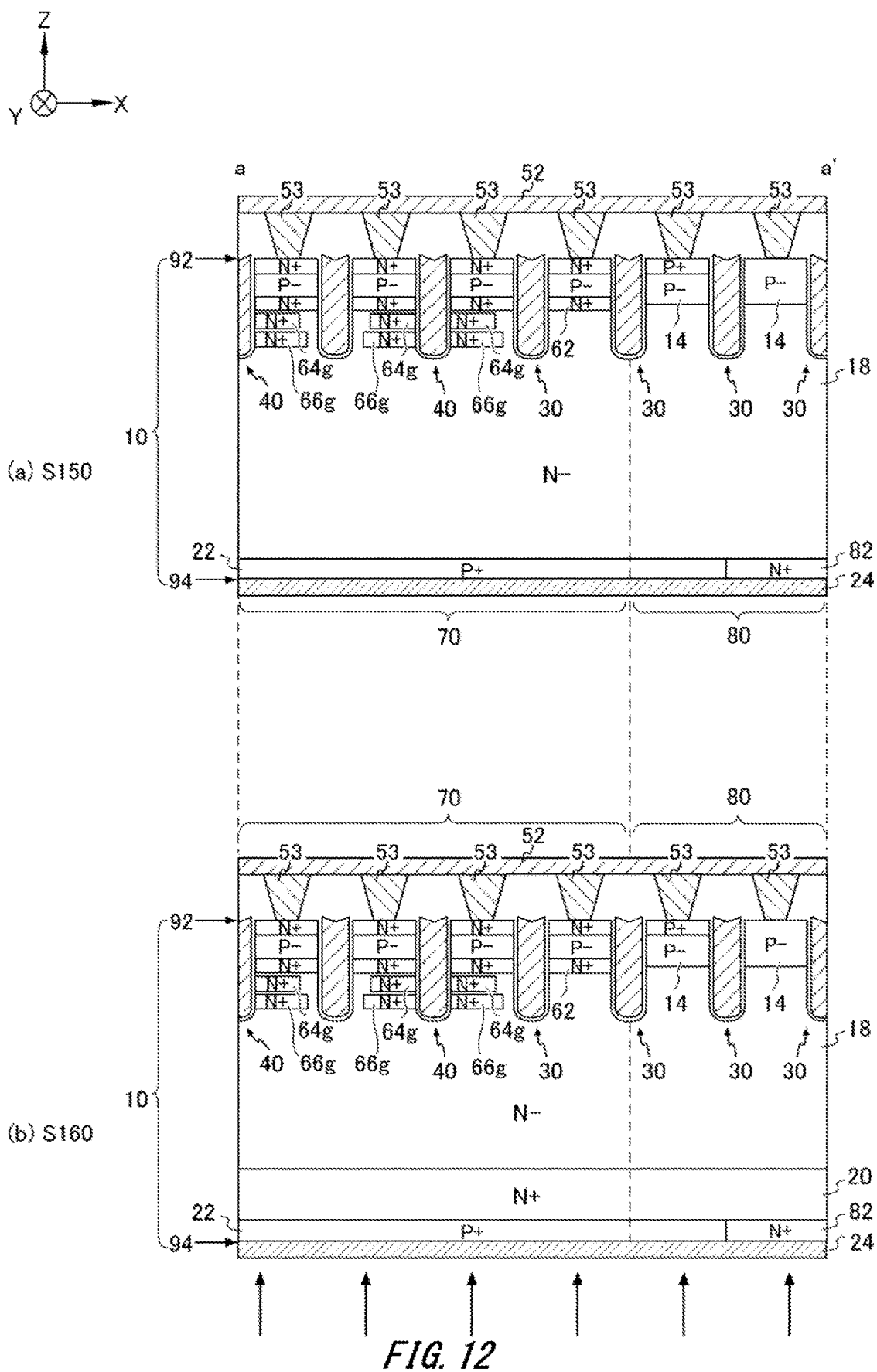
FIG. 12 includes views showing step S150 to step S160.

FIG. 12 includes views showing step S150 and step S160. (a) in FIG. 12 shows step S150 that forms the P+ type collector region 22, the N+ type cathode region 82 and the collector electrode 24. The collector region 22 and the cathode region 82 may be formed by ion implantation. Also, the collector electrode 24 may have a lamination structure formed by sputtering. The collector electrode 24 may be formed by the following manner: a titanium layer is formed in direct contact with the lower surface 94; a nickel layer is formed in direct contact with that titanium layer; and a gold layer is formed in direct contact with that nickel layer.

(b) in FIG. 12 shows step S160 that forms the buffer region 20. At step S160, protons may be implanted from the lower surface 94. Protons may be implanted in the buffer region 20 by a plurality of times at different depth positions. Also, after the implantation of protons, the semiconductor substrate 10 may be subjected to an annealing to activate the protons implanted in the buffer region 20. For example, the annealing is performed at a temperature from about 350 degrees C. to about 450 degrees C. in order to activate the ion implanted protons. Thereby, a plurality of peaks may be formed in the doping concentration distribution of the buffer region 20 in the depth direction. Note that the formation of the collector electrode 24 may be performed after the formation of the buffer region 20. Thus, the semiconductor device 100 can be manufactured.

Figure 13:
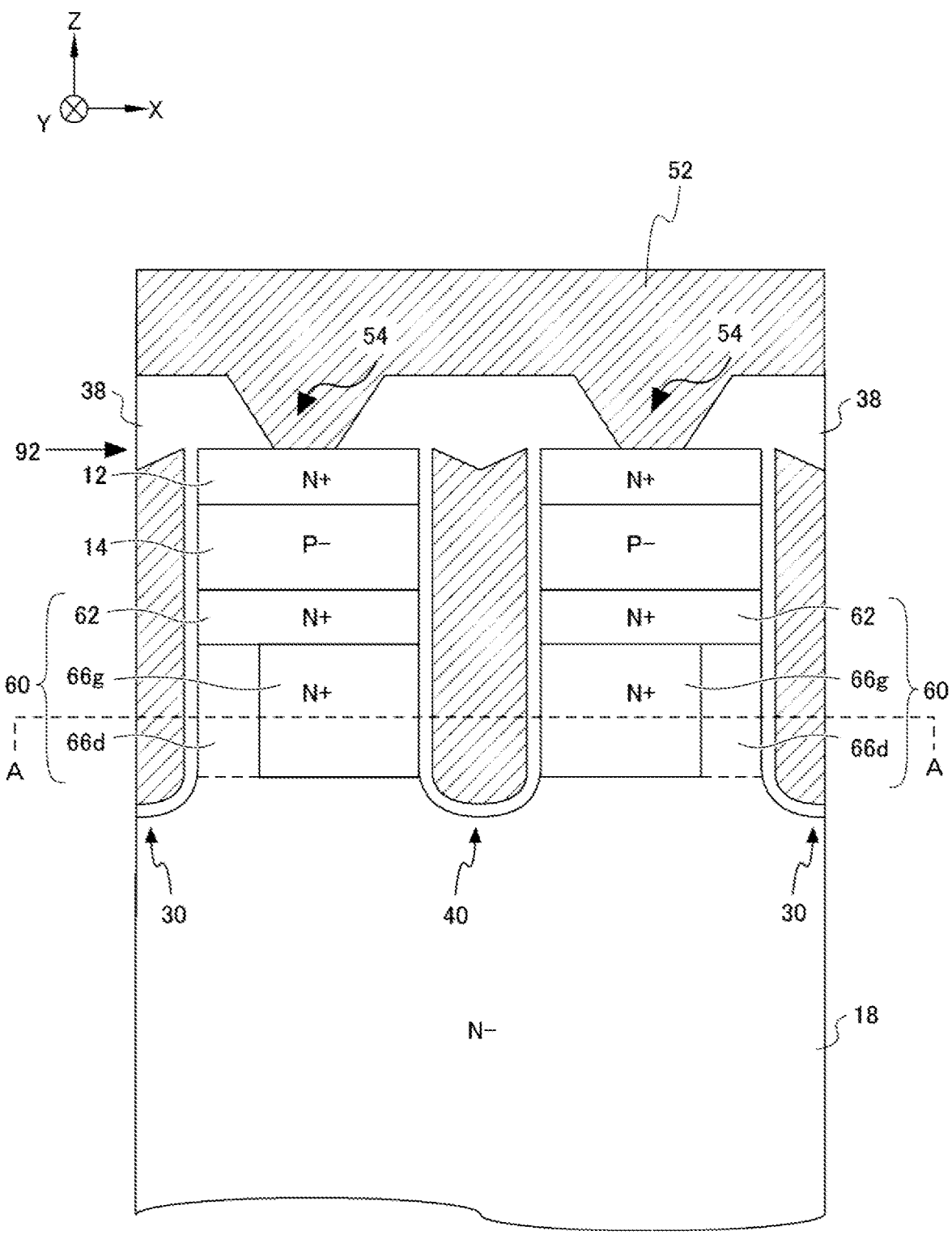
FIG. 13 is an enlarged view in the vicinity of a gate trench section 40 in a first modification example.

FIG. 13 is an enlarged view in the vicinity of a gate trench section 40 in a first modification example. The upper accumulation area 62 of the present example is the same as that in the example of FIG. 2. However, the semiconductor substrate 10 of the present example does not have an intermediate accumulation area 64. Also, in the present example, the upper accumulation area 62 and the lower accumulation area 66 are provided step-wise in the depth direction. Such a point is different from the example of FIG. 2.

The lower accumulation area 66 of the present example may have the gate vicinity area 66g and the dummy vicinity area 66d. The gate vicinity area 66g may have a peak of the doping concentration as shown in the example of FIG. 3, and may have a uniform doping concentration without peaks. The dummy vicinity area 66d may have a doping concentration lower than the peak concentration of the gate vicinity area 66g, and may have the same doping concentration as that of the drift region 18. Also in the present example, the advantageous effect in the example of FIG. 6B can be acquired.

Figure 14:
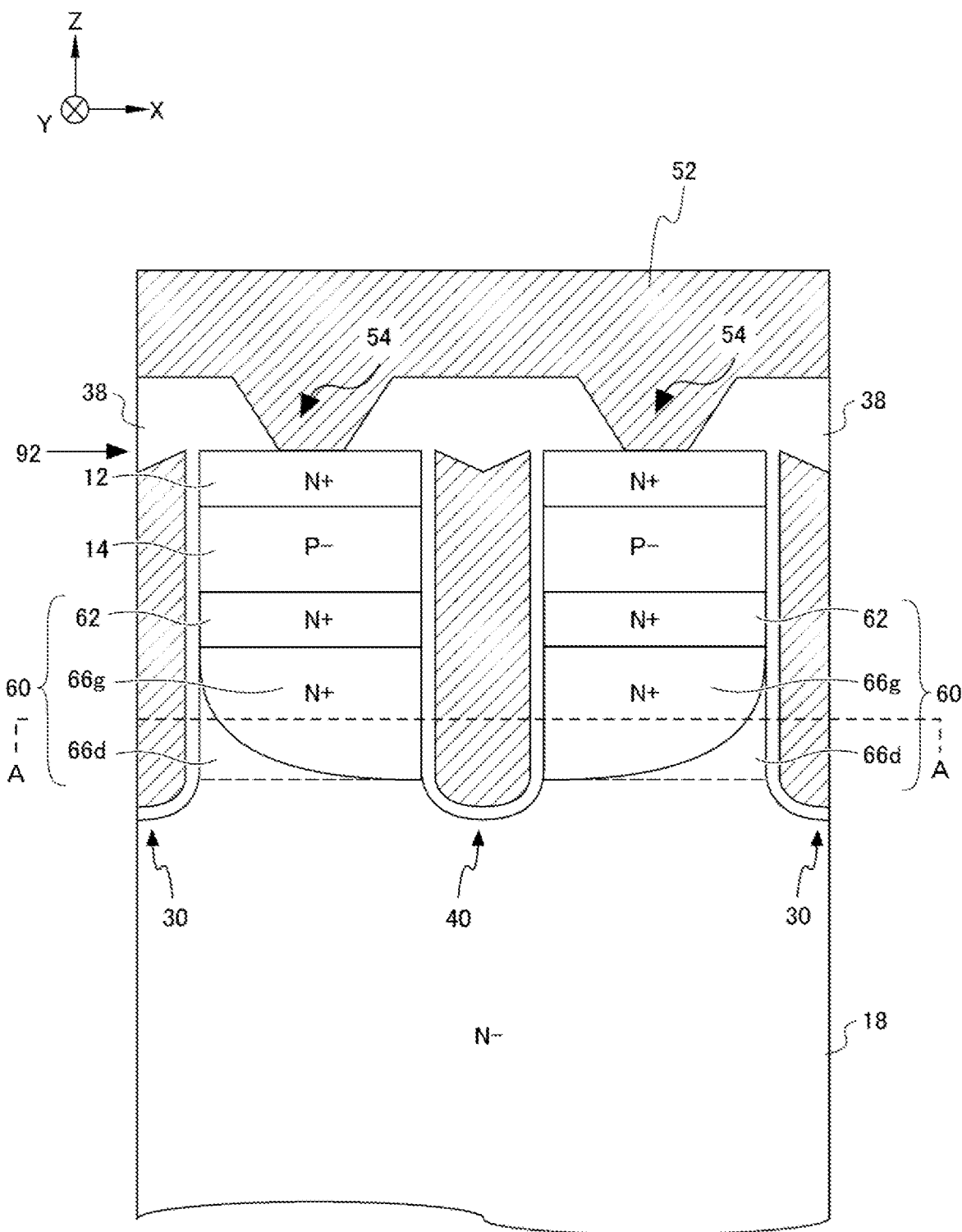
FIG. 14 is an enlarged view in the vicinity of the gate trench section 40 in a second modification example.

FIG. 14 is an enlarged view in the vicinity of a gate trench section 40 in a second modification example. In the lower accumulation area 66 of the present example, the length of the gate vicinity area 66g in the arrangement direction (X-axis direction) is gradually shortened across from the lower end of the upper accumulation area 62 to the lower end of the gate trench section 40. That is, the outer shape of the gate vicinity area 66g is provided in a curved shape. Such a point is different from the example of FIG. 13.

In the present example, corresponding to the length of the gate vicinity area 66g in the arrangement direction, the length of the dummy vicinity area 66d in the arrangement direction is gradually lengthened as going downward. Such a point is different from the first modification example of FIG. 13. Also in the present example, the advantageous effect in the example of FIG. 6B can be acquired.

Figure 15:
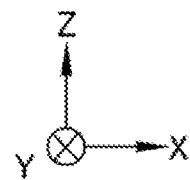
FIG. 15 is a view showing doping concentration distributions in sections A-A of FIG. 13 and FIG. 14.
Figure 15:
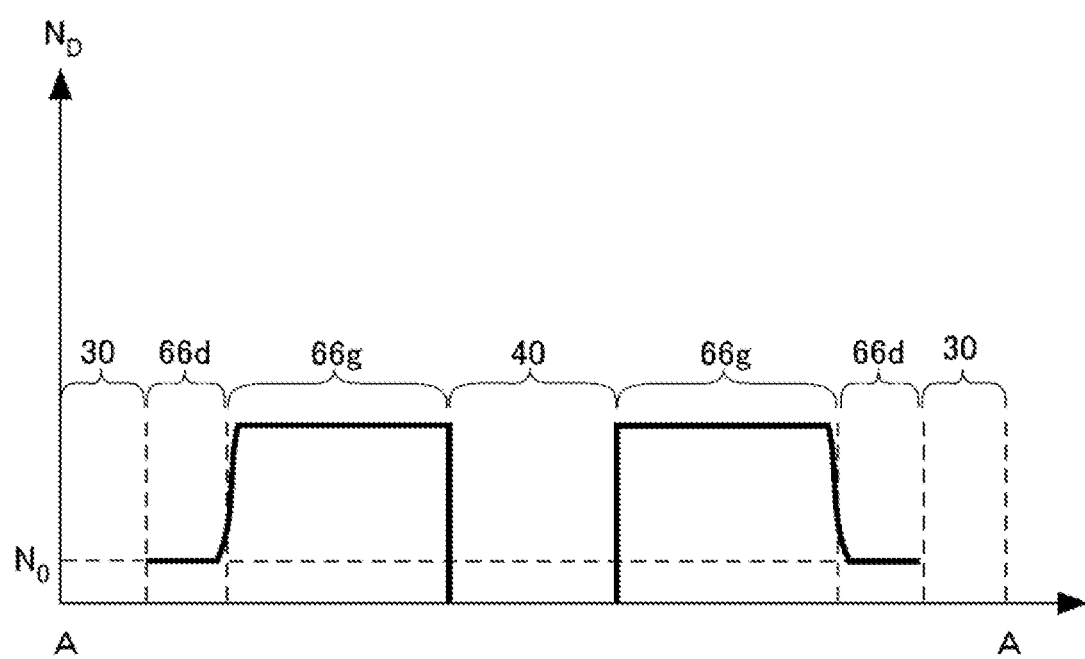

FIG. 15 is a view showing doping concentration distributions in sections A-A in FIG. 13 and FIG. 14. The vertical axis indicates a doping concentration $N_D$ corresponding to a logarithmic display. The multiple accumulation areas 60 may be completely separated from the dummy trench section 30. The complete separation may comprise, for example, a region having a doping concentration $N_0$ in the drift region 18 between the multiple accumulation areas 60 and the dummy trench section 30. Also in the present example, the advantageous effect in the example of FIG. 6B can be acquired.

Figure 16:
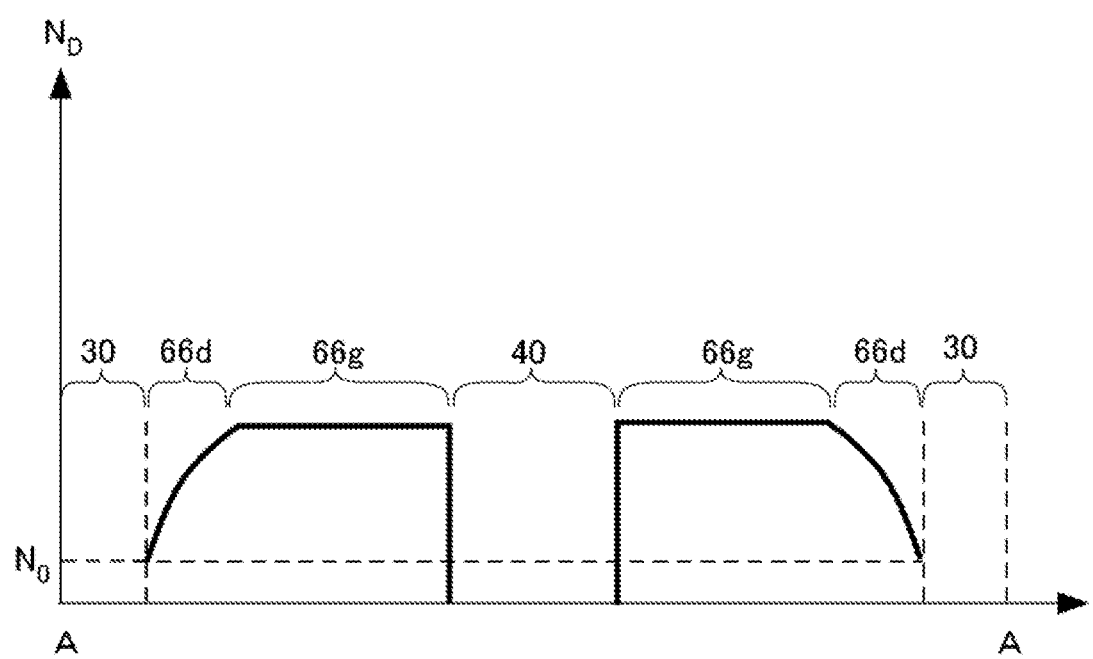
FIG. 16 is a view showing another example of the doping concentration distributions in the sections A-A of FIG. 13 and FIG. 14.

On the other hand, FIG. 16 is a view showing another example of the doping concentration distributions in the sections A-A of FIG. 13 and FIG. 14. As shown in FIG. 16, the multiple accumulation areas may be in contact with the dummy trench section 30 as reducing the concentration toward the dummy trench section 30, and may be separated from the dummy trench section 30. Also in the present example, the advantageous effect in the example of FIG. 6B can be acquired.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

Numeral 10 . . . semiconductor substrate, 11 . . . well region, 12 . . . emitter region, 14 . . . base region, 15 . . . contact region, 18 . . . drift region, 20 . . . buffer region, 21 . . . connecting portion, 22 . . . collector region, 24 . . . collector electrode, 25 . . . connecting portion, 30 . . . dummy trench section, 32 . . . dummy trench insulating film, 33 . . . dummy trench, 34 . . . dummy conductive section, 38 . . . interlayer dielectric film, 40 . . . gate trench section, 42 . . . gate insulating film, 43 . . . gate trench, 44 . . . gate conductive section, 48 . . . gate metal runner, 49 . . . contact hole, 50 . . . gate metal layer, 52 . . . emitter electrode, 53 . . . plug, 54, 56 and 58 . . . contact holes, 60 . . . multiple accumulation areas, 62 . . . upper accumulation area, 64 . . . intermediate accumulation area, 64g . . . gate vicinity area, 64d . . . dummy vicinity area, 66 . . . lower accumulation area, 66g . . . gate vicinity area, 66d . . . dummy vicinity area, 70 . . . transistor section, 80 . . . diode section, 82 . . . cathode region, 92 . . . upper surface, 94 . . . lower surface, 100 . . . semiconductor device, 102 . . . thermally oxidized film, 104 . . . conductive layer, 112 . . . mask material, 114 . . . mask material.

What is claimed is:

1. A manufacturing method of a semiconductor device comprising:
    forming a trench section including a gate trench section and a dummy trench section in a semiconductor substrate having a drift region of a first conductivity type;
    ion implanting first impurities of the first conductivity type in a transistor section including the gate trench section and the dummy trench section from an upper surface of the semiconductor substrate, to form an upper accumulation area; and
    ion implanting second impurities of the first conductivity type in a state where a mask material is provided over the dummy trench section in the transistor section, to form at least a lower accumulation area,
    wherein the upper accumulation area is in direct contact with the gate trench section and the dummy trench section, in an arrangement direction of the gate trench section and the dummy trench section, and in an extending direction in which longitudinal portions of the gate trench section and the dummy trench section extend, in a top view of the semiconductor substrate, the lower accumulation area has:
a gate vicinity area closer to the gate trench section than to the dummy trench section in the arrangement direction; and
a dummy vicinity area closer to the dummy trench section than to the gate trench section in the arrangement direction, the dummy vicinity area having a doping concentration of the first conductivity type lower than a doping concentration of the first conductivity type of the gate vicinity area, and
the upper accumulation area is closer to the upper surface of the semiconductor substrate than the lower accumulation area.

2. The method according to claim 1, wherein the ion implanting the second impurities of the first conductivity type in the state where the mask material is provided over the dummy trench section in the transistor section includes forming an intermediate accumulation area located between the upper accumulation area and the lower accumulation area.

3. The method according to claim 2, wherein the forming the intermediate accumulation area includes:
forming an intermediate gate vicinity area closer to the gate trench section than to the dummy trench section in the arrangement direction, and forming an intermediate dummy vicinity area closer to the dummy trench section than to the gate trench section in the arrangement direction,
wherein a doping concentration of the first conductivity type of the intermediate gate vicinity area is higher than a doping concentration of the first conductivity type of the intermediate dummy vicinity area, and a length in the arrangement direction of the intermediate gate vicinity area is shorter than a length in the arrangement direction of the gate vicinity area in the lower accumulation area.

4. The method according to claim 3, wherein
a length in the arrangement direction between the gate trench section and the dummy trench section is defined as Wm,
the length in the arrangement direction of the intermediate gate vicinity area is defined as Wa, and
Wm and Wa satisfy an expression: $0.55 \leq Wa/Wm \leq 0.95$.

5. The method according to claim 2, wherein the forming the intermediate accumulation area includes:
forming an intermediate gate vicinity area closer to the gate trench section than to the dummy trench section in the arrangement direction, and forming an intermediate dummy vicinity area closer to the dummy trench section than to the gate trench section in the arrangement direction,
wherein a doping concentration of the first conductivity type of the intermediate gate vicinity area is lower than a doping concentration of the first conductivity type of the gate vicinity area in the lower accumulation area.

6. The method according to claim 1, wherein the first and second impurities of the first conductivity type are phosphorous or protons.

7. The method according to claim 1, wherein a width of the mask material is larger than a width of the dummy trench section.

8. The method according to claim 1, wherein, in the arrangement direction, the dummy vicinity area of the lower accumulation area has a region in which the doping concentration of the dummy vicinity area gradually reduces in a direction toward the dummy trench section.

9. The method according to claim 1, wherein the doping concentration of the first conductivity type of the dummy vicinity area is the same as a doping concentration of the first conductivity type of the drift region.

10. The method according to claim 1, wherein the doping concentration of the first conductivity type of the dummy vicinity area is higher than a doping concentration of the first conductivity type of the drift region, and is lower than a peak concentration in the doping concentration of the first conductivity type of the gate vicinity area in a depth direction orthogonal to the arrangement direction from the upper surface of the semiconductor substrate toward a lower surface of the semiconductor substrate.

11. The method according to claim 1, wherein the ion implanting the second impurities of the first conductivity type in the state where the mask material is provided over the dummy trench section in the transistor section includes forming the lower accumulation area in a vicinity of a lower end of the gate trench section in a depth direction orthogonal to the arrangement direction from the upper surface of the semiconductor substrate toward a lower surface of the semiconductor substrate such that the lower accumulation area does not exceed the lower end of the gate trench section.

12. The method according to claim 1, wherein
the doping concentration of the gate vicinity area has a uniform region in the arrangement direction, and the doping concentration of the dummy vicinity area has a uniform region, and
add doping concentration in a boundary of the gate vicinity area and the dummy vicinity area varies stepwise.

13. The method according to claim 1, wherein
the semiconductor substrate further includes a diode section, and
the ion implanting the first impurities of the first conductivity type to form the upper accumulation area includes implanting the impurities of the first conductivity type in the transistor section without providing the mask material over the transistor section.

14. The method according to claim 1, wherein the ion implanting the first impurities of the first conductivity type to form the upper accumulation area includes implanting protons.

15. The method according to claim 1, wherein the ion implanting the second impurities of the first conductivity type in the state where the mask material is provided over the dummy trench section in the transistor section includes performing a plurality of implantations of protons, each of the plurality of implantations of protons being at a different range.

* * * * *